(12) United States Patent
Lin

(10) Patent No.: US 8,129,265 B2
(45) Date of Patent: Mar. 6, 2012

(54) HIGH PERFORMANCE SYSTEM-ON-CHIP DISCRETE COMPONENTS USING POST PASSIVATION PROCESS

(75) Inventor: Mou-Shiung Lin, Hsin-Chu (TW)

(73) Assignee: Megica Corporation, Hsinchu (TW)

( * ) Notice: Subject to any disclaimer, the term of this patent is extended or adjusted under 35 U.S.C. 154(b) by 503 days.

(21) Appl. No.: 11/062,277

(22) Filed: Feb. 18, 2005

(65) Prior Publication Data
US 2005/0170634 A1  Aug. 4, 2005

Related U.S. Application Data

(62) Division of application No. 10/445,560, filed on May 27, 2003, now Pat. No. 6,869,870.

(51) Int. Cl.
*H01L 21/4763* (2006.01)
(52) U.S. Cl. ........ 438/622; 438/624; 438/125; 438/613; 438/637
(58) Field of Classification Search .................. None
See application file for complete search history.

(56) References Cited

U.S. PATENT DOCUMENTS

| | | | |
|---|---|---|---|
| 4,021,838 A | 5/1977 | Warwick | |
| 4,598,307 A * | 7/1986 | Wakabayashi et al. ....... 257/665 |
| 4,685,998 A | 8/1987 | Quinn et al. | |
| 4,885,841 A * | 12/1989 | McNabb ............. 29/834 |
| 5,049,979 A * | 9/1991 | Hashemi et al. ............ 257/723 |
| 5,055,907 A | 10/1991 | Jacobs ............... 357/71 |
| 5,095,402 A | 3/1992 | Hernandez et al. | |
| 5,106,461 A | 4/1992 | Nolfson et al. ........... 205/125 |
| 5,182,172 A | 1/1993 | Tucker | |
| 5,212,403 A | 5/1993 | Nakanishi et al. ........... 257/664 |
| 5,226,232 A | 7/1993 | Boyd | |
| 5,370,766 A | 12/1994 | Desaigoudar et al. | |
| 5,372,967 A | 12/1994 | Sundaram et al. .......... 437/60 |
| 5,416,356 A | 5/1995 | Staudinger | |
| 5,478,773 A | 12/1995 | Dow et al. | |
| 5,501,006 A | 3/1996 | Gehman, Jr. et al. ........ 29/840 |
| 5,519,582 A | 5/1996 | Matsuzaki | |
| 5,527,998 A | 6/1996 | Anderson | |
| 5,576,680 A | 11/1996 | Ling ...................... 336/200 |
| 5,608,262 A | 3/1997 | Degani et al. | |
| 5,608,268 A | 3/1997 | Senanayake | |
| 5,629,240 A * | 5/1997 | Malladi et al. ............. 438/106 |
| 5,635,767 A | 6/1997 | Wenzel et al. ............. 257/778 |
| 5,686,764 A | 11/1997 | Fulcher ................... 527/778 |

(Continued)

FOREIGN PATENT DOCUMENTS

FR  2793943  11/2000

(Continued)

OTHER PUBLICATIONS

Co-pending U.S. patent, filed May 27, 2003, U.S. Appl. No. 10/445,558, "High Performance System-on-Chip Inductor Using Post Passivation Process," to a common assignee.

(Continued)

*Primary Examiner* — David Graybill
(74) *Attorney, Agent, or Firm* — McDermott Will & Emery LLP

(57) ABSTRACT

A system and method for forming post passivation discrete components, is described. High quality discrete components are formed on a layer of passivation, or on a thick layer of polymer over a passivation layer.

56 Claims, 23 Drawing Sheets

U.S. PATENT DOCUMENTS

| | | | |
|---|---|---|---|
| 5,742,100 A | 4/1998 | Schroeder et al. | |
| 5,763,108 A | 6/1998 | Chang et al. | |
| 5,789,303 A | 8/1998 | Leung et al. | |
| 5,827,776 A * | 10/1998 | Bandyopadhyay et al. | 438/624 |
| 5,842,626 A * | 12/1998 | Bhansali et al. | 228/180.22 |
| 5,884,990 A | 3/1999 | Burghartz et al. | 336/200 |
| 5,930,637 A | 7/1999 | Chuang | |
| 5,949,654 A * | 9/1999 | Fukuoka | 361/760 |
| 5,969,422 A | 10/1999 | Ting | |
| 6,008,102 A | 12/1999 | Alford et al. | 438/381 |
| 6,025,261 A | 2/2000 | Farrar | |
| 6,051,489 A | 4/2000 | Young | |
| 6,114,938 A | 9/2000 | Iida | |
| 6,168,854 B1 * | 1/2001 | Gibbs | 428/209 |
| 6,169,030 B1 | 1/2001 | Naik | |
| 6,180,445 B1 * | 1/2001 | Tsai | 438/238 |
| 6,184,589 B1 | 2/2001 | Budnaitis | |
| 6,236,101 B1 | 5/2001 | Erdeljac et al. | |
| 6,236,103 B1 | 5/2001 | Bernstein | |
| 6,278,264 B1 | 8/2001 | Burstein et al. | |
| 6,303,423 B1 * | 10/2001 | Lin | 438/238 |
| 6,329,715 B1 | 12/2001 | Hayashi | |
| 6,365,498 B1 | 4/2002 | Chu et al. | |
| 6,376,895 B2 | 4/2002 | Farrar | |
| 6,383,916 B1 * | 5/2002 | Lin | 438/637 |
| 6,399,997 B1 * | 6/2002 | Lin et al. | 257/531 |
| 6,417,089 B1 * | 7/2002 | Kim et al. | 438/612 |
| 6,424,034 B1 | 7/2002 | Ahn et al. | |
| 6,432,479 B2 | 8/2002 | Chang | |
| 6,441,715 B1 | 8/2002 | Johnson | |
| 6,445,271 B1 | 9/2002 | Johnson | |
| 6,455,885 B1 | 9/2002 | Lin | |
| 6,456,183 B1 | 9/2002 | Basteres et al. | 336/200 |
| 6,459,135 B1 | 10/2002 | Basteres et al. | 257/528 |
| 6,465,879 B1 | 10/2002 | Taguchi | |
| 6,489,647 B1 | 12/2002 | Lin | |
| 6,489,656 B1 | 12/2002 | Lin | |
| 6,495,442 B1 | 12/2002 | Lin | |
| 6,501,169 B1 | 12/2002 | Aoki et al. | |
| 6,501,185 B1 * | 12/2002 | Chow et al. | 257/780 |
| 6,515,355 B1 | 2/2003 | Jiang | |
| 6,515,369 B1 | 2/2003 | Lin | |
| 6,545,354 B1 | 4/2003 | Aoki et al. | |
| 6,559,528 B2 | 5/2003 | Watase et al. | |
| 6,570,247 B1 | 5/2003 | Eiles | |
| 6,644,536 B2 * | 11/2003 | Ratificar et al. | 228/234.1 |
| 6,734,563 B2 | 5/2004 | Lin et al. | |
| 6,756,664 B2 | 6/2004 | Yang | |
| 6,847,066 B2 | 1/2005 | Tahara et al. | |
| 6,852,616 B2 | 2/2005 | Sahara et al. | |
| 6,897,507 B2 * | 5/2005 | Lin | 257/300 |
| 6,914,331 B2 | 7/2005 | Shimoishizaka et al. | |
| 6,921,980 B2 | 7/2005 | Nakanishi et al. | |
| 6,952,049 B1 * | 10/2005 | Ogawa et al. | 257/700 |
| 7,405,149 B1 * | 7/2008 | Lin et al. | 438/622 |
| 7,416,971 B2 * | 8/2008 | Lin et al. | 438/618 |
| 2001/0016410 A1 | 8/2001 | Cheung | |
| 2002/0017730 A1 | 2/2002 | Tahara | |
| 2002/0064922 A1 * | 5/2002 | Lin | 438/381 |
| 2002/0068441 A1 * | 6/2002 | Lin | 438/637 |
| 2002/0109232 A1 * | 8/2002 | Lin et al. | 257/758 |
| 2002/0115282 A1 * | 8/2002 | Lin et al. | 438/622 |
| 2002/0121692 A1 * | 9/2002 | Lee et al. | 257/737 |
| 2002/0180064 A1 * | 12/2002 | Hwan et al. | 257/780 |
| 2003/0037959 A1 * | 2/2003 | Master et al. | 174/256 |
| 2003/0038331 A1 | 2/2003 | Aoki et al. | |
| 2003/0071326 A1 * | 4/2003 | Lin | 257/531 |
| 2003/0107136 A1 * | 6/2003 | Lin et al. | 257/758 |
| 2003/0121958 A1 * | 7/2003 | Ratificar et al. | 228/246 |
| 2003/0170934 A1 * | 9/2003 | Lin | 438/118 |
| 2003/0197283 A1 * | 10/2003 | Choi | 257/777 |
| 2003/0222295 A1 * | 12/2003 | Lin | 257/300 |
| 2003/0224613 A1 * | 12/2003 | Ramanathan et al. | 438/745 |
| 2004/0016752 A1 * | 1/2004 | Ratificar et al. | 219/679 |
| 2004/0016948 A1 * | 1/2004 | Lin | 257/300 |
| 2004/0029404 A1 * | 2/2004 | Lin | 438/958 |
| 2004/0079966 A1 * | 4/2004 | Lin et al. | 257/200 |
| 2004/0094841 A1 | 5/2004 | Matsuzaki et al. | |
| 2004/0166659 A1 * | 8/2004 | Lin et al. | 438/611 |
| 2004/0166661 A1 * | 8/2004 | Lei | 438/614 |
| 2004/0183209 A1 | 9/2004 | Lin | |
| 2004/0245580 A1 * | 12/2004 | Lin | 257/379 |
| 2005/0032351 A1 * | 2/2005 | Lin et al. | 438/618 |
| 2005/0087844 A1 * | 4/2005 | Lin et al. | 257/634 |
| 2005/0170634 A1 * | 8/2005 | Lin | 438/622 |
| 2005/0184358 A1 * | 8/2005 | Lin | 257/531 |
| 2005/0200023 A1 * | 9/2005 | Lin | 257/758 |
| 2005/0208757 A1 * | 9/2005 | Lin | 438/622 |
| 2005/0230783 A1 * | 10/2005 | Lin | 257/531 |
| 2005/0245067 A1 * | 11/2005 | Lin | 438/624 |
| 2005/0250255 A1 * | 11/2005 | Chen | 438/127 |
| 2005/0258548 A1 * | 11/2005 | Ogawa et al. | 257/778 |
| 2005/0260849 A1 * | 11/2005 | Lin | 438/637 |
| 2005/0263893 A1 * | 12/2005 | Lin et al. | 257/758 |
| 2005/0266612 A1 * | 12/2005 | Lin | 438/108 |
| 2005/0277281 A1 * | 12/2005 | Dubin et al. | 438/618 |
| 2006/0012049 A1 * | 1/2006 | Lin | 257/760 |
| 2006/0038231 A9 * | 2/2006 | Lin et al. | 257/361 |
| 2006/0043594 A1 * | 3/2006 | Lin | 257/758 |
| 2006/0051955 A1 * | 3/2006 | Lin | 438/622 |
| 2007/0108551 A1 * | 5/2007 | Lin | 257/531 |
| 2007/0181970 A1 * | 8/2007 | Lin | 257/531 |
| 2007/0182521 A1 * | 8/2007 | Lin | 336/200 |
| 2007/0202684 A1 * | 8/2007 | Lin | 438/622 |
| 2007/0202685 A1 * | 8/2007 | Lin | 438/622 |
| 2007/0262455 A1 * | 11/2007 | Lin | 257/758 |
| 2007/0262456 A1 * | 11/2007 | Lin | 257/758 |
| 2007/0262457 A1 * | 11/2007 | Lin | 257/758 |
| 2007/0262458 A1 * | 11/2007 | Lin | 257/759 |
| 2007/0262459 A1 * | 11/2007 | Lin | 257/759 |
| 2007/0262460 A1 * | 11/2007 | Lin | 257/759 |
| 2007/0267714 A1 * | 11/2007 | Lin | 257/503 |
| 2007/0273032 A1 * | 11/2007 | Lin | 257/759 |
| 2007/0273033 A1 * | 11/2007 | Lin | 257/759 |
| 2007/0273034 A1 * | 11/2007 | Lin | 257/759 |
| 2007/0273035 A1 * | 11/2007 | Lin | 257/759 |
| 2007/0273036 A1 * | 11/2007 | Lin | 257/759 |
| 2007/0273037 A1 * | 11/2007 | Lin | 257/759 |
| 2007/0273038 A1 * | 11/2007 | Lin | 257/759 |
| 2007/0273039 A1 * | 11/2007 | Lin | 257/759 |
| 2007/0273040 A1 * | 11/2007 | Lin | 257/759 |
| 2007/0273041 A1 * | 11/2007 | Lin | 257/759 |
| 2007/0278679 A1 * | 12/2007 | Lin | 257/739 |
| 2007/0278684 A1 * | 12/2007 | Lin | 257/759 |
| 2007/0278685 A1 * | 12/2007 | Lin | 257/759 |
| 2007/0278686 A1 * | 12/2007 | Lin | 257/759 |
| 2007/0278687 A1 * | 12/2007 | Lin | 257/759 |
| 2007/0278688 A1 * | 12/2007 | Lin | 257/760 |
| 2007/0278689 A1 * | 12/2007 | Lin | 257/760 |
| 2007/0278690 A1 * | 12/2007 | Lin | 257/760 |
| 2007/0278691 A1 * | 12/2007 | Lin | 257/760 |
| 2007/0281458 A1 * | 12/2007 | Lei | 438/614 |
| 2007/0281463 A1 * | 12/2007 | Lin | 438/623 |
| 2007/0281467 A1 * | 12/2007 | Lin | 438/625 |
| 2007/0281468 A1 * | 12/2007 | Lin | 438/625 |
| 2007/0284739 A1 * | 12/2007 | Lin | 257/737 |
| 2007/0284750 A1 * | 12/2007 | Lin | 257/759 |
| 2007/0284751 A1 * | 12/2007 | Lin | 257/759 |
| 2007/0284752 A1 * | 12/2007 | Lin | 257/759 |
| 2007/0284753 A1 * | 12/2007 | Lin | 257/760 |
| 2007/0288880 A1 * | 12/2007 | Lin | 716/13 |
| 2007/0290348 A1 * | 12/2007 | Lin | 257/759 |
| 2007/0290349 A1 * | 12/2007 | Lin | 257/759 |
| 2007/0290350 A1 * | 12/2007 | Lin | 257/759 |
| 2007/0290351 A1 * | 12/2007 | Lin | 257/759 |
| 2007/0290352 A1 * | 12/2007 | Lin | 257/759 |
| 2007/0290353 A1 * | 12/2007 | Lin | 257/759 |
| 2007/0290354 A1 * | 12/2007 | Lin | 257/759 |
| 2007/0290355 A1 * | 12/2007 | Lin | 257/759 |
| 2007/0290356 A1 * | 12/2007 | Lin | 257/759 |
| 2007/0290357 A1 * | 12/2007 | Lin | 257/759 |
| 2007/0290358 A1 * | 12/2007 | Lin | 257/759 |
| 2007/0290368 A1 * | 12/2007 | Lin | 257/778 |
| 2007/0293036 A1 * | 12/2007 | Lin | 438/623 |
| 2007/0293037 A1 * | 12/2007 | Lin | 438/623 |
| 2008/0035972 A1 * | 2/2008 | Lin | 257/296 |
| 2008/0035974 A1 * | 2/2008 | Lin | 257/300 |

| | | | | |
|---|---|---|---|---|
| 2008/0038869 A1* | 2/2008 | Lin | | 438/107 |
| 2008/0042238 A1* | 2/2008 | Lin | | 257/531 |
| 2008/0042239 A1* | 2/2008 | Lin | | 257/532 |
| 2008/0042273 A1* | 2/2008 | Lin | | 257/737 |
| 2008/0042289 A1* | 2/2008 | Lin | | 257/759 |
| 2008/0044976 A1* | 2/2008 | Lin | | 438/381 |
| 2008/0044977 A1* | 2/2008 | Lin | | 438/381 |
| 2008/0048329 A1* | 2/2008 | Lin | | 257/759 |
| 2008/0050909 A1* | 2/2008 | Lin et al. | | 438/620 |
| 2008/0050912 A1* | 2/2008 | Lin et al. | | 438/623 |
| 2008/0050913 A1* | 2/2008 | Lin | | 438/623 |
| 2008/0083987 A1* | 4/2008 | Lin | | 257/738 |
| 2008/0083988 A1* | 4/2008 | Lin | | 257/738 |
| 2008/0093745 A1* | 4/2008 | Lin | | 257/759 |
| 2008/0111243 A1* | 5/2008 | Lin | | 257/759 |
| 2008/0121943 A1* | 5/2008 | Lin et al. | | 257/211 |
| 2008/0124918 A1* | 5/2008 | Lee et al. | | 438/637 |
| 2008/0136034 A1* | 6/2008 | Lin et al. | | 257/758 |
| 2008/0142980 A1* | 6/2008 | Lin | | 257/759 |
| 2008/0142981 A1* | 6/2008 | Lin | | 257/759 |
| 2008/0146020 A1* | 6/2008 | Lin | | 438/623 |
| 2008/0233733 A1* | 9/2008 | Lin | | 438/617 |
| 2008/0246154 A1* | 10/2008 | Lin et al. | | 257/759 |
| 2009/0146307 A1* | 6/2009 | Lin et al. | | 257/758 |

FOREIGN PATENT DOCUMENTS

| | | |
|---|---|---|
| TW | 490803 | 6/2002 |
| TW | 497176 | 8/2002 |
| TW | 498492 | 8/2002 |
| TW | 506045 | 10/2002 |
| TW | 507479 | 10/2002 |
| TW | 513761 | 12/2002 |
| TW | 519707 | 2/2003 |
| TW | 519726 | 2/2003 |
| TW | 533533 | 5/2003 |
| TW | 533559 | 5/2003 |

OTHER PUBLICATIONS

Co-pending U.S. Patent, filed May 27, 2003, U.S. Appl. No. 10/445,559, "High Performance System-on-Chip Passive Device Using Post Passivation Process", to a common assignee.

Maloney, T. et al. "Novel Clamp Circuits for IC Power Supply Protection," IEEE Transactions on Components, Packaging, and Manufacturing Technology, Part C, vol. 19, No. 3 (Jul. 1996) pp. 150-161.

Lin, M.S. et al. "A New System-on-a-Chip (SOC) Technolog—High Q Post Passivation Inductors," Proceedings from the 53rd Electronic Components and Technology Conference (May 30, 2003) pp. 1503-1509.

Megic Corp. "MEGIC way to system solutions through bumping and redistribution," (Brochure) (Feb. 6, 2004) pp. 1-3.

Lin, M.S. "Post Passivation Technology™-13 MEGIC® Way to System Solutions," Presentation given at TSMC Technology Symposium, Japan (Oct. 1, 2003) pp. 1-32.

Lin, M.S. et al. "A New IC Interconnection Scheme and Design Architecture for High Performace ICs at Very Low Fabrication Cost—Post Passivation Interconnection," Proceedings of the IEEE Custom Integrated Circuits Conference (Sep. 24, 2003) pp. 533-536.

* cited by examiner

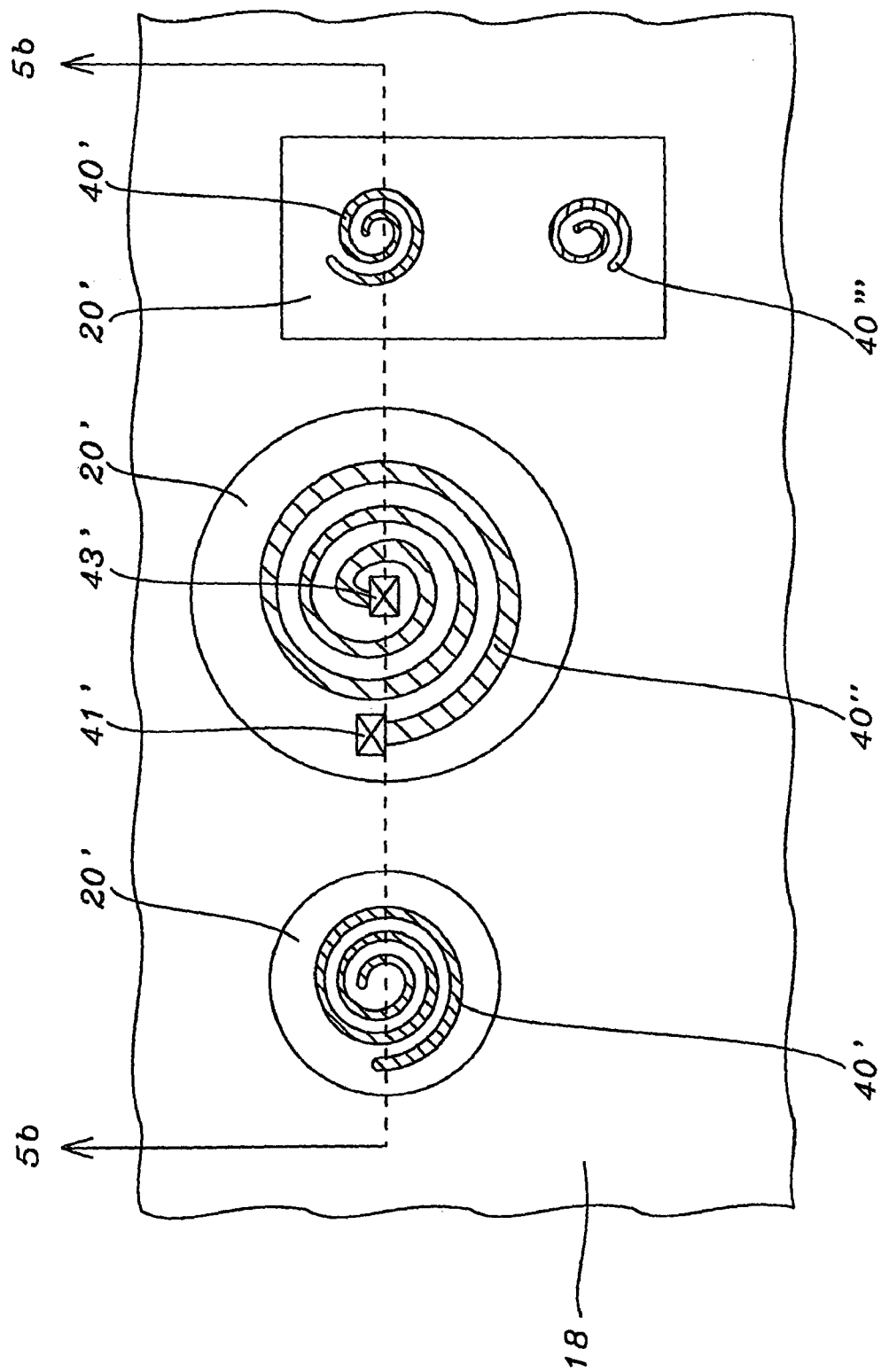

HIGH PERFORMANCE SYSTEM-ON-CHIP DISCRETE COMPONENTS USING POST PASSIVATION PROCESS

This is a division of application Ser. No. 10/445,560, filed on May 27, 2003, now U.S. Pat. No. 6,869,870.

RELATED PATENT APPLICATIONS

This application is related to Ser. No. 10/445,558, filed on May 27, 2003, and assigned to a common assignee.

This application is related to Ser. No. 10/445,559, filed on May 27, 2003, and assigned to a common assignee.

BACKGROUND OF THE INVENTION (1) Field of the Invention

The invention relates to the manufacturing of high performance Integrated Circuits (IC's), and, more specifically, to methods of creating high performance electrical components (such as an inductor) on the surface of a semiconductor substrate by reducing the electromagnetic losses that are typically incurred in the surface of the substrate.

(2) Description of the Related Art

The continued emphasis in the semiconductor technology is to create improved performance semiconductor devices at competitive prices. This emphasis over the years has resulted in extreme miniaturization of semiconductor devices, made possible by continued advances of semiconductor processes and materials in combination with new and sophisticated device designs. Most of the semiconductor devices that are at this time being created are aimed at processing digital data. There are however also numerous semiconductor designs that are aimed at incorporating analog functions into devices that simultaneously process digital and analog data, or devices that can be used for the processing of only analog data. One of the major challenges in the creation of analog processing circuitry (using digital processing procedures and equipment) is that a number of the components that are used for analog circuitry are large in size and are therefore not readily integrated into devices that typically have feature sizes that approach the sub-micron range. The main components that offer a challenge in this respect are capacitors and inductors, since both these components are, for typical analog processing circuits, of considerable size.

A typical application for inductors of the invention is in the field of modern mobile communication applications. One of the main applications of semiconductor devices in the field of mobile communication is the creation of Radio Frequency (RF) amplifiers. RF amplifiers contain a number of standard components. A major component of a typical RF amplifier is a tuned circuit that contains inductive and capacitive components. Tuned circuits form, dependent on and determined by the values of their inductive and capacitive components, an impedance that is frequency dependent, enabling the tuned circuit to either present a high or a low impedance for signals of a certain frequency. The tuned circuit can therefore either reject or pass and further amplify components of an analog signal, based on the frequency of that component. The tuned circuit can in this manner be used as a filter to filter out or remove signals of certain frequencies or to remove noise from a circuit configuration that is aimed at processing analog signals. The tuned circuit can also be used to form a high electrical impedance by using the LC resonance of the circuit and to thereby counteract the effects of parasitic capacitances that are part of a circuit. One of the problems that is encountered when creating an inductor on the surface of a semiconductor substrate is that the self-resonance that is caused by the parasitic capacitance between the (spiral) inductor and the underlying substrate will limit the use of the inductor at high frequencies. As part of the design of such an inductor it is therefore of importance to reduce the capacitive coupling between the created inductor and the underlying substrate.

At high frequencies, the electromagnetic field that is generated by the inductor induces eddy currents in the underlying silicon substrate. Since the silicon substrate is a resistive conductor, the eddy currents will consume electromagnetic energy resulting in significant energy loss, resulting in a low Q inductor. This is one of the main reasons for a low Q value of an inductor, whereby the resonant frequency of 1/{square root}(LC) limits the upper boundary of the frequency. In addition, the eddy currents that are induced by the inductor will interfere with the performance of circuitry that is in close physical proximity to the inductor. Furthermore, the fine metal lines used to form the inductor also consume energy, due to the metal's resistance, and result in low Q inductors.

It has already been pointed out that one of the key components used in creating high frequency analog semiconductor devices is the inductor that forms part of an LC resonance circuit. In view of the high device density that is typically encountered in semiconductor devices and the subsequent intense use of the substrate surface area, the creation of the inductor must incorporate the minimization of the surface area that is required for the inductor, while at the same time maintaining a high Q value for the inductor. Typically, inductors that are created on the surface of a substrate are of a spiral shape whereby the spiral is created in a plane that is parallel with the plane of the surface of the substrate. Conventional methods that are used to create the inductor on the surface of a substrate suffer several limitations. Most high Q inductors form part of a hybrid device configuration or of Monolithic Microwave Integrated Circuits (MMIC's) or are created as discrete components, the creation of which is not readily integratable into a typical process of Integrated Circuit manufacturing. It is clear that, by combining the creation on one semiconductor monolithic substrate of circuitry that is aimed at the functions of analog data manipulation and analog data storage with the functions of digital data manipulation and digital data storage, a number of significant advantages can be achieved. Such advantages include the reduction of manufacturing costs and the reduction of power consumption by the combined functions. The spiral form of the inductor that is created on the surface of a semiconductor substrate however results, due to the physical size of the inductor, in parasitic capacitances between the inductor wiring and the underlying substrate and causes electromagnetic energy losses in the underlying resistive silicon substrate. These parasitic capacitances have a serious negative effect on the functionality of the created LC circuit by sharply reducing the frequency of resonance of the tuned circuit of the application.

More seriously, the inductor-generated electromagnetic field will induce eddy currents in the underlying resistive silicon substrate, causing a significant energy loss that results in low Q inductors.

The performance parameter of an inductor is typically indicated by the Quality (Q) factor of the inductor. The quality factor Q of an inductor is defined as Q=Es/El, wherein Es is the energy that is stored in the reactive portion of the component while El is the energy that is lost in the reactive portion of the component. The higher the quality of the component, the closer the resistive value of the component approaches zero while the Q factor of the component approaches infinity. For inductors that are created overlying a silicon substrate, the electromagnetic energy that is created by the inductor will primarily be lost in the resistive silicon of the underlying substrate and in the metal lines that are created to form the inductor. For components, the quality factor serves as a measure of the purity of the reactance (or the susceptance) of the component, which can be degraded due to the resistive silicon substrate, the resistance of the metal lines and dielectric losses. In an actual configuration, there are always some physical resistors that will dissipate power, thereby decreasing the power that can be recovered. The quality factor Q is dimensionless. A Q value of greater than 100 is considered very high for discrete inductors that are mounted on the surface of Printed Circuit Boards. For inductors that form part of an integrated circuit, the Q value is typically in the range between about 3 and 10.

In creating an inductor on a monolithic substrate on which additional semiconductor devices are created, the parasitic capacitances that occur as part of this creation limit the upper bound of the cut-off frequency that can be achieved for the inductor using conventional silicon processes. This limitation is, for many applications, not acceptable. Dependent on the frequency at which the LC circuit is designed to resonate, significantly larger values of quality factor, such as for instance 50 or more, must be available. Prior Art has in this been limited to creating values of higher quality factors as separate units, and in integrating these separate units with the surrounding device functions. This negates the advantages that can be obtained when using the monolithic construction of creating both the inductor and the surrounding devices on one and the same semiconductor substrate. The non-monolithic approach also has the disadvantage that additional wiring is required to interconnect the sub-components of the assembly, thereby again introducing additional parasitic capacitances and resistive losses over the interconnecting wiring network. For many of the applications of a RF amplifier, such as portable battery powered applications, power consumption is at a premium and must therefore be as low as possible. By raising the power consumption, the effects of parasitic capacitances and resistive power loss can be partially compensated, but there are limitations to even this approach. These problems take on even greater urgency with the rapid expansion of wireless applications, such as portable telephones and the like. Wireless communication is a rapidly expanding market, where the integration of RF integrated circuits is one of the most important challenges. One of the approaches is to significantly increase the frequency of operation to for instance the range of 10 to 100 GHz. For such high frequencies, the value of the quality factor obtained from silicon-based inductors is significantly degraded. For applications in this frequency range, monolithic inductors have been researched using other than silicon as the base for the creation of the inductors. Such monolithic inductors have for instance been created using sapphire or GaAs as a base. These inductors have considerably lower substrate losses than their silicon counterparts (no eddy current, hence no loss of electromagnetic energy) and therefore provide much higher Q inductors. Furthermore, they have lower parasitic capacitance and therefore provide higher frequency operation capabilities. Where however more complex applications are required, the need still exists to create inductors using silicon as a substrate. For those applications, the approach of using a base material other than silicon has proven to be too cumbersome while for instance GaAs as a medium for the creation of semiconductor devices is as yet a technical challenge that needs to be addressed. It is known that GaAs is a semi-insulating material at high frequencies, reducing the electromagnetic losses that are incurred in the surface of the GaAs substrate, thereby increasing the Q value of the inductor created on the GaAs surface. GaAs RF chips however are expensive; a process that can avoid the use of GaAs RF chips therefore offers the benefit of cost advantage.

A number of different approaches have been used to incorporate inductors into a semiconductor environment without sacrificing device performance due to substrate losses. One of these approaches has been to selectively remove (by etching) the silicon underneath the inductor (using methods of micro machining), thereby removing substrate resistive energy losses and parasitic effects. Another method has been to use multiple layers of metal (such as aluminum) interconnects or of copper damascene interconnects.

Other approaches have used a high resistivity silicon substrate thereby reducing resistive losses in the silicon substrate. Resistive substrate losses in the surface of the underlying substrate form a dominant factor in determining the Q value of silicon inductors. Further, biased wells have been proposed underneath a spiral conductor, this again aimed at reducing inductive losses in the surface of the substrate. A more complex approach has been to create an active inductive component that simulates the electrical properties of an inductor as it is applied in active circuitry. This latter approach however results in high power consumption by the simulated inductor and in noise performance that is unacceptable for low power, high frequency applications. All of these approaches have as common objectives to enhance the quality (Q) value of the inductor and to reduce the surface area that is required for the creation of the inductor. The most important consideration in this respect is the electromagnetic energy losses due to the electromagnetic induced eddy currents in the silicon substrate.

When the dimensions of Integrated Circuits are scaled down, the cost per die is decreased while some aspects of performance are improved. The metal connections which connect the Integrated Circuit to other circuit or system components become of relative more importance and have, with the further miniaturization of the IC, an increasingly negative impact on circuit performance. The parasitic capacitance and resistance of the metal interconnections increase, which degrades the chip performance significantly. Of most concern in this respect is the voltage drop along the power and ground buses and the RC delay of the critical signal paths. Attempts to reduce the resistance by using wider metal lines result in higher capacitance of these wires.

Current techniques for building an inductor on the surface of a semiconductor substrate use fine-line techniques whereby the inductor is created under a layer of passivation. This however implies close physical proximity between the created inductor and the surface of the substrate over which the inductor has been created (typically less than 10 µm), resulting in high electromagnetic losses in the silicon substrate which in turn results in reducing the Q value of the inductor.

U.S. Pat. No. 5,212,403 (Nakanishi) shows a method of forming wiring connections both inside and outside (in a wiring substrate over the chip) for a logic circuit depending on the length of the wire connections.

U.S. Pat. No. 5,501,006 (Gehman, Jr. et al.) shows a structure with an insulating layer between the integrated circuit (IC) and the wiring substrate. A distribution lead connects the bonding pads of the IC to the bonding pads of the substrate.

U.S. Pat. No. 5,055,907 (Jacobs) discloses an extended integration semiconductor structure that allows manufacturers to integrate circuitry beyond the chip boundaries by forming a thin film multi-layer wiring decal on the support substrate and over the chip. However, this reference differs from the invention.

U.S. Pat. No. 5,106,461 (Volfson et al.) teaches a multi layer interconnect structure of alternating polyimide (dielectric) and metal layers over an IC in a TAB structure.

U.S. Pat. No. 5,635,767 (Wenzel et al.) teaches a method for reducing RC delay by a PBGA that separates multiple metal layers.

U.S. Pat. No. 5,686,764 (Fulcher) shows a flip chip substrate that reduces RC delay by separating the power and I/O traces.

U.S. Pat. No. 6,008,102 (Alford et al.) shows a helix inductor using two metal layers connected by vias.

U.S. Pat. No. 5,372,967 (Sundaram et al.) discloses a helix inductor.

U.S. Pat. No. 5,576,680 (Ling) and U.S. Pat. No. 5,884,990 (Burghartz et al.) show other helix inductor designs.

SUMMARY OF THE INVENTION

It is the primary objective of the invention to improve the RF performance of High Performance Integrated Circuits.

Another objective of the invention is to provide a method for the creation of a high-Q inductor.

Another objective of the invention is to replace the GaAs chip with a silicon chip as a base on which a high-Q inductor is created.

Yet another objective of the invention is to extend the frequency range of the inductor that is created on the surface of a silicon substrate.

It is yet another objective of the invention to create high quality passive electrical components overlying the surface of a silicon substrate.

The above referenced U.S. Pat. No. 6,383,916 adds, in a post passivation processing sequence, a thick layer of dielectric over a layer of passivation and layers of wide and thick metal lines on top of the thick layer of dielectric. The present invention extends referenced U.S. Pat. No. 6,383,916 by in addition creating high quality electrical components, such as an inductor, a capacitor or a resistor, on a layer of passivation or on the surface of a thick layer of dielectric. In addition, the process of the invention provides a method for mounting discrete passive electrical components on the surface of Integrated Circuit chips.

BRIEF DESCRIPTION OF THE DRAWINGS

FIGS. 5b-5c are a cross-sectional representation, and top view, respectively, of inductors of the invention formed on an isolated section of polymer.

DESCRIPTION OF THE PREFERRED EMBODIMENTS

U.S. Pat. No. 6,383,916, assigned to a common assignee as the current invention, teaches an Integrated Circuit structure where re-distribution and interconnect metal layers are created in layers of dielectric over the passivation layer of a conventional Integrated Circuit (IC). A layer of passivation is deposited over the IC, a thick layer of polymer is alternately deposited over the surface of the layer of passivation, and thick, wide metal lines are formed over the passivation.

U.S. Pat. No. 6,303,423, also assigned to a common assignee as the current invention, addresses, among other objectives, the creation of an inductor whereby the emphasis is on creating an inductor of high Q value above the passivation layer of a semiconductor substrate. The high quality of the inductor of the invention allows for the use of this inductor in high frequency applications while incurring minimum loss of power. The invention further addresses the creation of a capacitor and a resistor on the surface of a silicon substrate whereby the main objective (of the process of creating a capacitor and resistor) is to reduce parasitics that are typically incurred by these components in the underlying silicon substrate.

Figure 1:
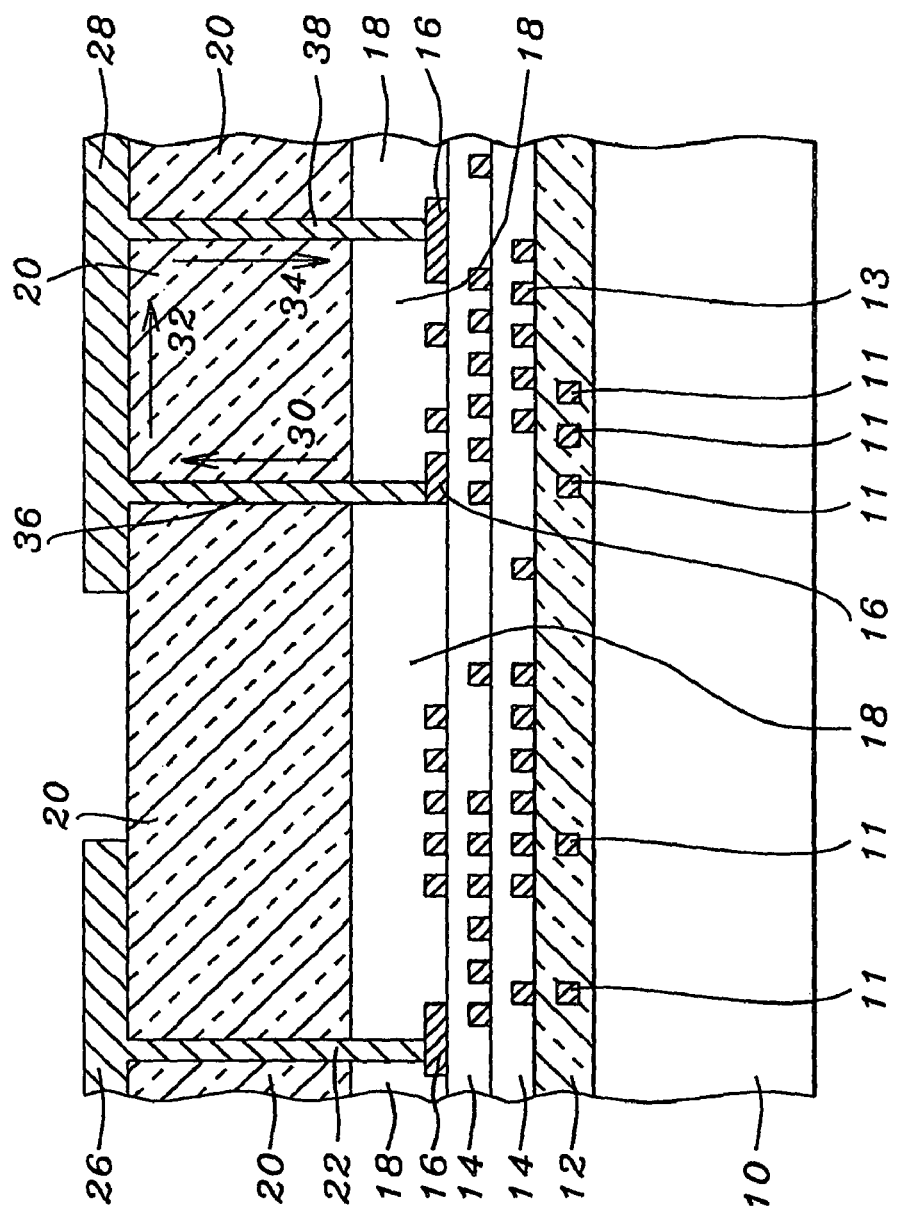
FIG. 1 is a cross sectional representation of the interconnection scheme shown in U.S. Pat. No. 6,383,916.

Referring now more specifically to FIG. 1, there is shown a cross section of one implementation of U.S. Pat. No. 6,383, 916. The surface of silicon substrate 10 has been provided with transistors 11 and other devices (not shown in FIG. 1). The surface of substrate 10 is covered by an interlevel dielectric (ILD) layer 12, formed over the devices.

Layers 14 represent metal and dielectric layers that are typically created over ILD 12. Layers 14 contain one or more layers of dielectric, interspersed with one or more metal interconnect lines 13 that make up a network of electrical connections. At a top metal layer are points 16 of electrical contact. These points 16 of electrical contact can establish electrical interconnects to the transistors and other devices 11 that have been provided in and on the surface of the substrate 10. A passivation layer 18, formed of, for example, a composite layer of silicon oxide and silicon nitride, is deposited over the surface of layers 14, and functions to prevent the penetration of mobile ions (such as sodium ions), moisture, transition metal (such as gold, copper, silver), and other contamination. The passivation layer is used to protect the underlying devices (such as transistors, polysilicon resistors, poly-to-poly capacitors, etc.) and the fine-line metal interconnection.

The key steps of U.S. Pat. No. 6,383,916, begin with the deposition of a thick layer 20 of polyimide that is deposited over the surface of passivation layer 18. Access must be provided to points of electrical contact 16, for this reason a pattern of openings 22, 36 and 38 is formed through the polyimide layer 20 and the passivation layer 18; the pattern of openings 22, 36 and 38 aligns with the pattern of electrical contact points 16. Contact points 16 are, by means of the openings 22/36/38 that are created in the layer 20 of polyimide, electrically extended to the surface of layer 20.

Layer 20 is a polymer, and is preferably polyimide. Polymer 20 may optionally be photosensitive. Examples of other polymers that can be used include benzocyclobutene (BCB), parylene or epoxy-based material such as photoepoxy SU-8 (available from Sotec Microsystems, Renens, Switzerland).

After formation of openings 22/36/38, metallization is performed to create patterned wide metal layers 26 and 28, and to connect to contact points 16. Lines 26 and 28 can be of any design in width and thickness to accommodate specific circuit design requirements, which can be used for power distribution, or as a ground or signal bus. Furthermore, metal 26 may be connected off-chip through wire bonds or solder bumps.

Contact points 16 are located on top of a thin dielectric (layers 14, FIG. 1), and the pad size must be kept small to minimize capacitance with underlying metal layers. In addition, a large pad size will interfere with the routing capability of the layer of metal.

Layer 20 is a thick polymer dielectric layer (for example, polyimide) having a thickness in excess of 2 μm (after curing). The range of the polymer thickness can vary from 2 μm to 150 μm, dependent on electrical design requirements. For a thicker layer of polyimide, the polyimide film can be multiple coated and cured.

U.S. Pat. No. 6,383,916 B1 allows for the interconnection of circuit elements at various distances, over the path 30/32/34 shown in FIG. 1, using the thick, wide (as compared to the underlying "fine line" metallization in layers 14) metal of 28. Thick, wide metal 28 has smaller resistance and capacitance than the fine line metal 14 and is also easier and more cost effective to manufacture.

Figure 2:
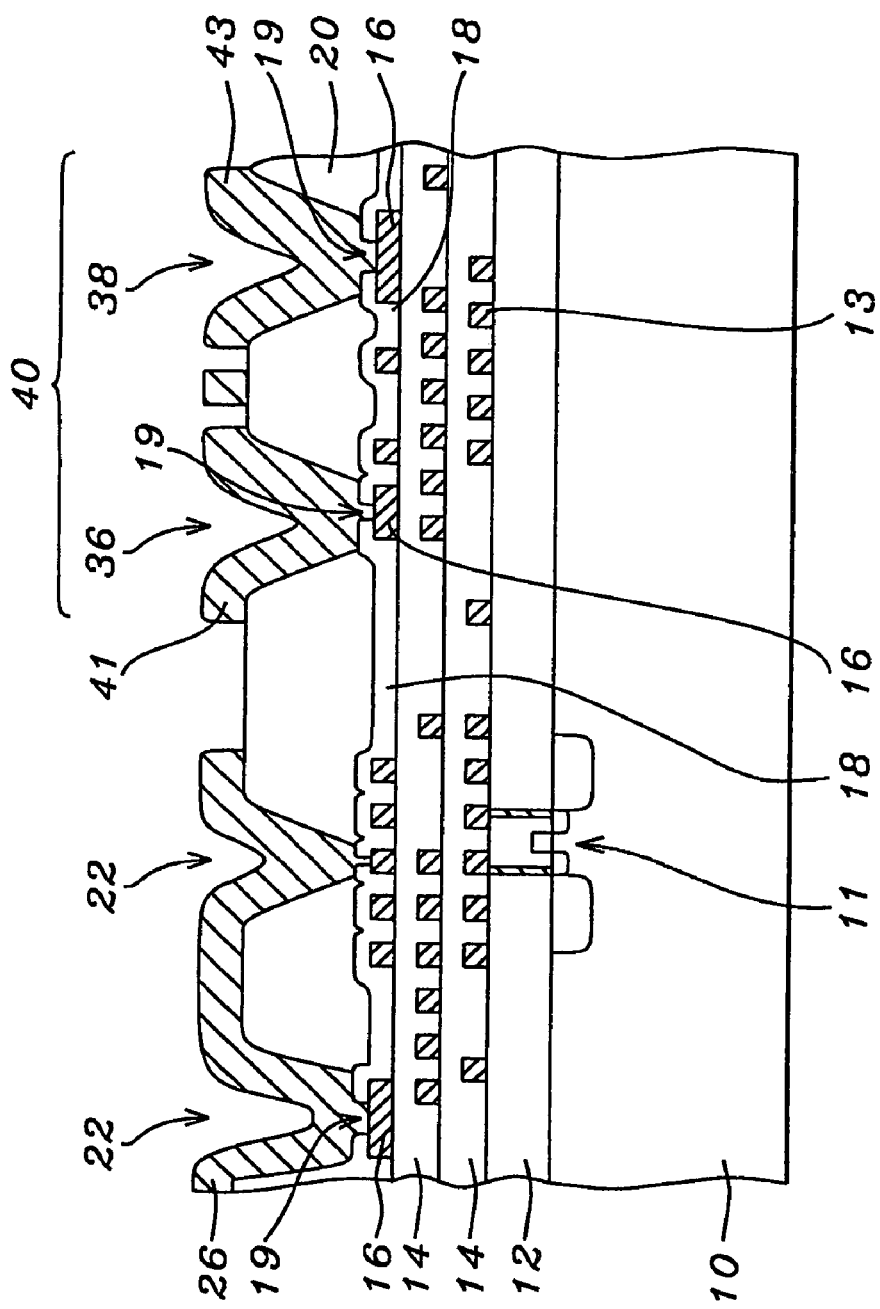
FIG. 2 is a cross sectional representation of an inductor of the invention, created on a thick layer of polyimide.

FIG. 2 shows how the interconnect aspect of U.S. Pat. No. 6,383,916, can be modified to form an inductor on the surface of the thick layer 20 of polyimide. The inductor is created in a plane that is parallel with the surface of the substrate 10 whereby this plane however is separated from the surface of the substrate 10 by the combined heights of layers 12, 14, 18, and 20. FIG. 2 shows a cross section of the inductor 40 taken in a plane that is perpendicular to the surface of substrate 10. The wide and thick metal will also contribute to a reduction of the resistive energy losses. Furthermore, the low resistivity metal, such as gold, silver and copper, can be applied using electroplating; the thickness can be about 20 μm.

By increasing the distance between the inductor and the semiconductor surface, as compared to prior art approaches in which the inductor is formed under the passivation, the electromagnetic field in the silicon substrate will be reduced as the distance is increased, and the Q value of the inductor can be increased. The inductor overlies the layer of passivation and in addition, the inductor can be created on the surface of a thick layer of dielectric (such as a polymer) formed over the passivation layer. In addition, by using wide and thick metal for the creation of the inductor, the parasitic resistance is reduced.

In an important feature of the invention, the openings 19 in passivation layer 18 may be as small as 0.1 micrometers wide. Thus, contact pads 16 may also be nearly as small, which allows for greater routing capability in the top fine-line metallization layer, and lower capacitance.

In another important feature of the invention, the openings 22/36/38 in polymer 20 are larger than the passivation openings 19. The polymer openings 22/36/38 are aligned with passivation openings 19. The larger polymer openings allow for relaxed design rules, simpler opening formation, and the use of a thick metal layer for the post-passivation metallization of the invention.

FIG. 2 illustrates interconnect structure 26 as well as inductor 40, wherein the inductor includes two contacts 41 and 43, through polymer layer 20 to contact pads 16.

In another feature of the invention, the FIG. 2 structure may be covered by an additional layer of polymer (not shown).

Figure 24A:
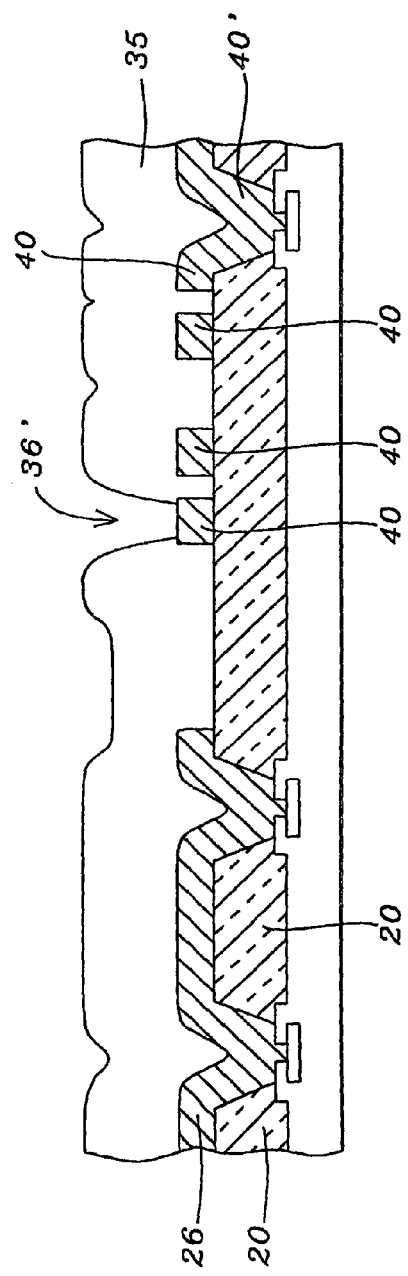
FIGS. 24a-24c show alternate methods of connecting to the inductor of the invention.
Figure 24B:
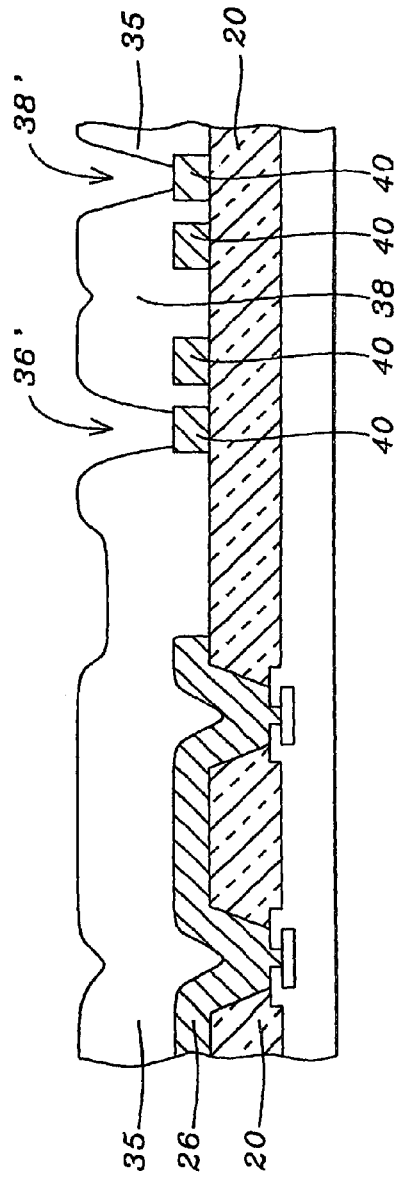

FIGS. 24a and 24b illustrate another feature of the invention, in which contacts to the inductor are formed in a different manner than the 2 downward contacts of FIG. 2. Specifically, in FIG. 24a, a layer 35 of dielectric, preferably polyimide or the like, is deposited over interconnection 26 and inductor 40. An opening 36' to one end of the inductor is then formed to expose one terminal of the inductor 40. Inductor 40 in FIG. 24a thus can have one contact extending upward, and a second contact 40' extending downward, in a "one-up, one-down" configuration.

FIG. 24b illustrates another alternative, in which 2 upward contact openings 36' and 38' are formed from inductor 40, in a "two-up" configuration.

In both FIGS. 24a and 24b, the upward contacts may be used for connection to external devices or packaging, by way of wire bonding, solder bumps, or the like. For wire bonding, an upper surface of inductor 40 must be formed of a wire-bondable material such as Au or Al. For solder bump connection, under bump metallization (UBM) would be formed in the upward contact opening, followed by solder bump formation.

In either of the FIG. 24a or 24b configurations, interconnections to other contact pads on the same die (as opposed to connections to external devices, as described in the previous paragraph) may be made through openings 36' and/or 38', using similar metallization (but as an additional layer) as used for structure 26 and inductor 40.

Figure 24C:
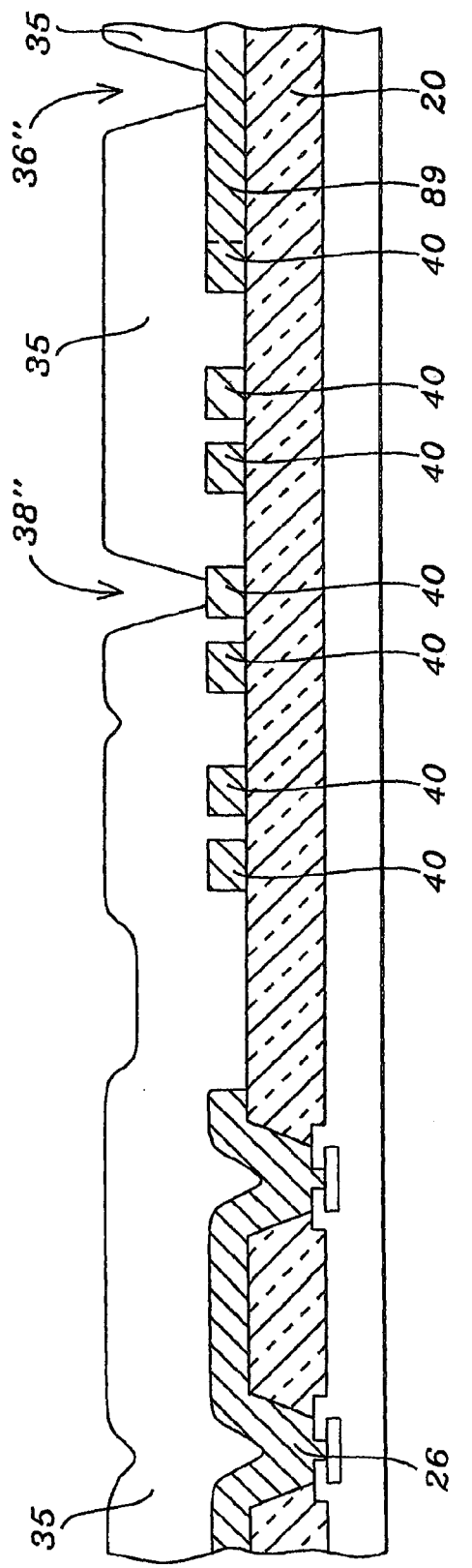

Referring now to FIG. 24c, another feature of the invention is shown in which extension 89, connected to inductor 40, is used to relocate the inductor 40 to a contact opening 36" at another location on the die, such as at the die edge. This may be useful for ease of wire bonding, for example. Opening 38"

is formed as earlier described. Extension 89 is formed at the same time and of the same metallization as structure 26 and inductor 40.

Similarly, extension 89 could be used to interconnect inductor 40 to another contact point on the same die, by making a downward contact (not shown, but described earlier) instead of upward contact 36".

If a contact to a center point of the inductor, such as that shown under opening 38" in FIG. 24c, is desired, then such contact cannot of course be made by an extension such as 89, but instead must be either upward or downward.

Figure 3:
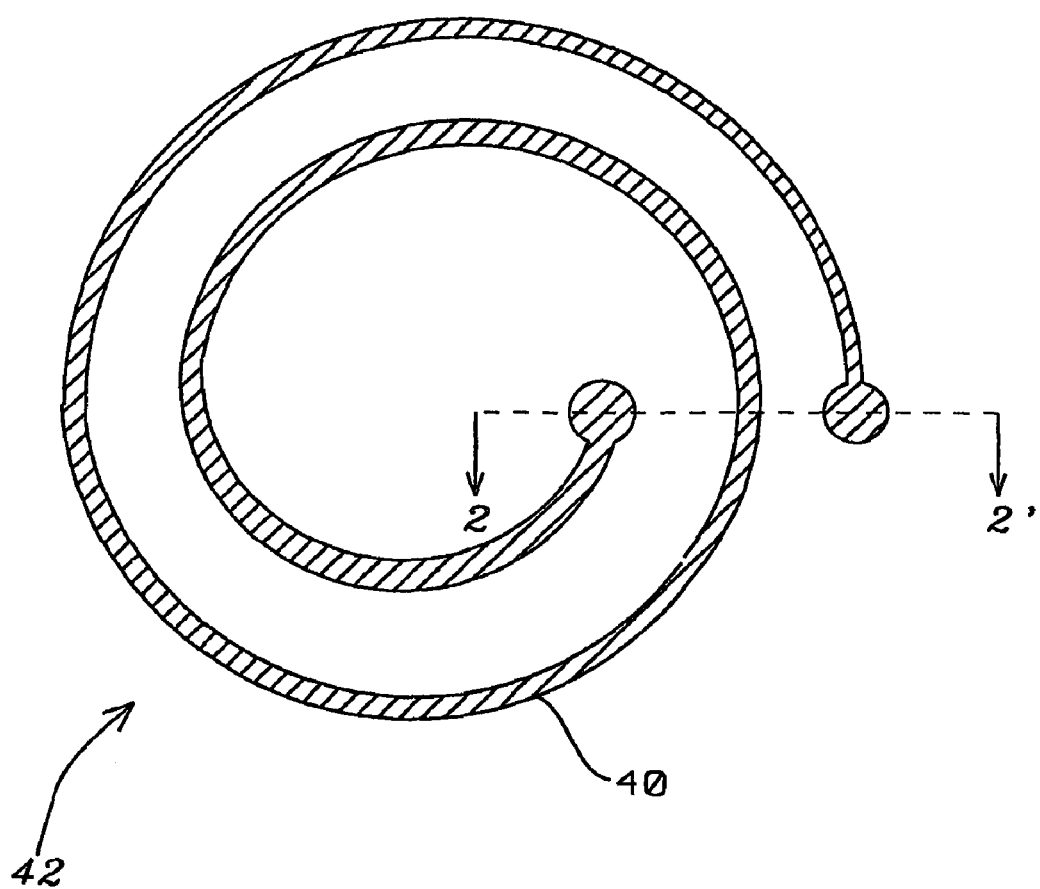
FIG. 3 is a top view of an inductor created following the process of the invention.

FIG. 3 shows a top view 42 of the spiral structure of the inductor 40 that has been created on the surface of layer 20 of dielectric. The inductor 40 cross section that is shown in FIG. 2 is taken along line 2-2-2' of FIG. 3.

Figure 4:
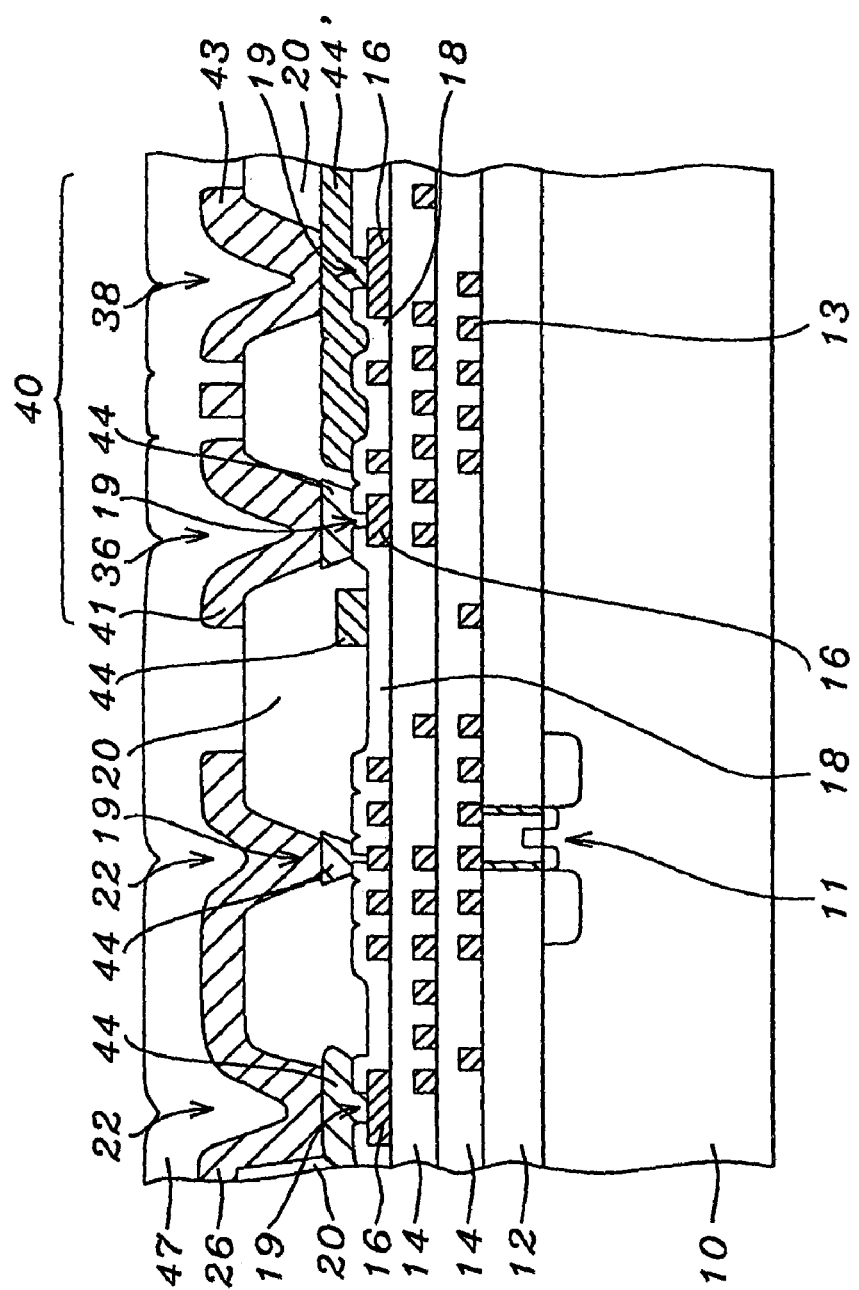
FIG. 4 is a cross sectional representation of a substrate and overlying layers;
an inductor has been created on the surface of a thick layer of polyimide, and a layer of conductive material has been added to further insulate the inductor from the underlying silicon substrate.

FIG. 4 shows a cross section of inductor 40 whereby the inductor has been further isolated from the surface of the substrate 10 by the addition of a conductive plate 44', of conducting material, formed under substantially all of the inductor, and preferably formed of Cu (copper) or Au (gold). The surface area of the conductive plate 44' typically extends over the surface of passivation layer 18 such that the inductor 40 aligns with and overlays the conductive plate 44'. The surface area of conductive plate 44' can be extended slightly beyond these boundaries to further improve shielding the surface of substrate 10 from the electromagnetic field of inductor 40.

Conductive plate 44' can be connected to one of the inductor terminals (as shown in FIG. 4, in which it is connected to the rightmost inductor terminal 43), or may be left at a floating voltage level, or may be connected to another voltage level, depending on the system's electrical design.

Conductive plate 44' is formed using the methods and material of the invention, as later described with regard to the metal layer used to form metal interconnect 26 and inductor 40. Conductive plate 44' is formed at the same time as connectors 44, which serve to connect the next level metal to contact points 16, as shown in FIG. 4.

Optionally, a second polymer layer 47 may be deposited over inductor 40 and interconnect structure 26, to provide additional protection of the metal structures.

Figure 12:
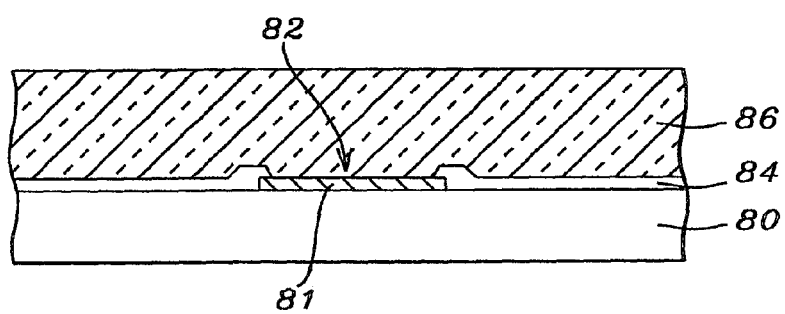
FIGS. 12-18 depict, in cross-sectional form, the creation of gold metal structures of the invention, through a layer of polymer.

Referring now to FIGS. 12-23, further details are provided for forming the post passivation inductor (and other passive devices) of the invention. In FIG. 12, a substrate 80 is shown, which could be an underlying dielectric layer, and a metal contact point 81, preferably comprising aluminum. A layer 84 of passivation has been patterned creating an opening 82 through layer 84 that exposes the contact pad 81. Layer 86 is a layer of polymer, preferably polyimide, as earlier described, deposited over the layer 84 of passivation, including the exposed surface of the contact pad. Polymer layer 86, such as polyimide, is typically spun on. For some thick layers of polymer, the polymer can be screen printed. Alternately, a laminated dry film polymer may be used.

Figure 13:
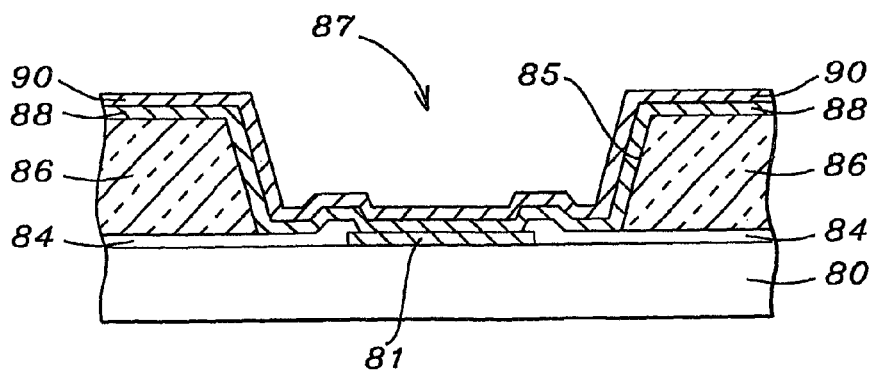

FIG. 13 illustrates forming an opening 87 in polymer 86, wherein the polymer opening 87 is larger than passivation opening 82. Opening 87 is depicted having sloped sides 85. Polymer layer 86 is exposed and developed to form opening 87, which initially has vertical sidewalls. However, the subsequent curing process causes the sidewalls to have a slope 85, and a-opening 87 to have a resultant partially conical shape. The sidewall slope 85 may have an angle of 45 degrees or more, and is typically between about 50 and 60 degrees. It may be possible to form the sidewalls with an angle as small as 20 degrees.

By creating relatively large vias through the layer of polyimide or polymer, aligned with smaller vias created through the underlying layer of passivation, aligned with underlying sub-micron metal layer, it is clear that the sub-micron metal vias can effectively be enlarged when progressing from the sub-micron metal layer to the level of the wide metal.

Continuing to refer to FIG. 13, one metallization system and process for forming the post passivation interconnect and inductor of the invention is depicted. First, a glue/barrier layer 88, preferably comprising TiW, is deposited, preferably by sputtering to a thickness of between about 500 and 5,000 Angstroms. A gold seed layer 90, is next sputter deposited over the glue/barrier 88, to a thickness of between about 300 and 3,000 Angstroms.

Figure 14:
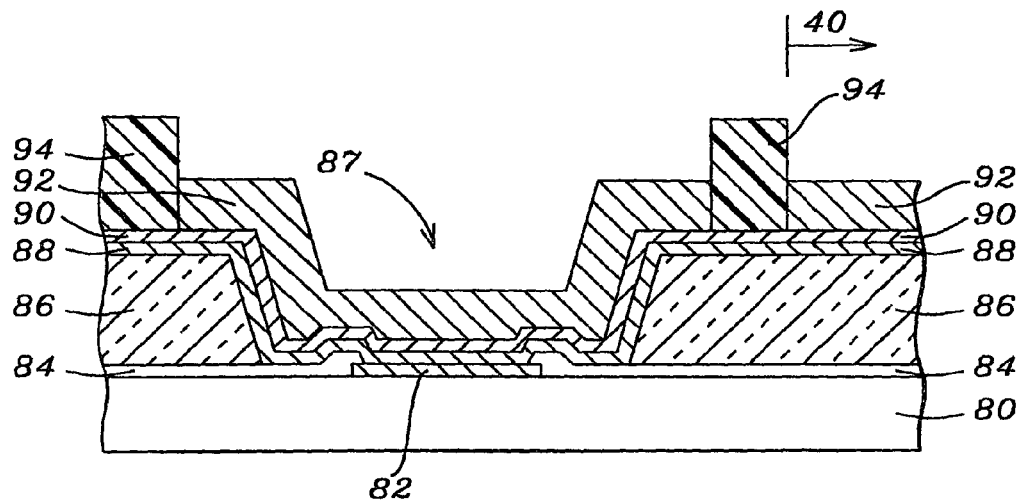

Referring now to FIG. 14, a bulk layer 92 of gold (Au) is next formed by electroplating, to a thickness of between about 1 and 20 µm. Electroplating is preceded by deposition of a thick photoresist 94 (to a thickness greater than the desired bulk metal thickness), and conventional lithography to expose the gold seed layer 90 in those areas where electroplating thick metallization is desired.

Figure 15:
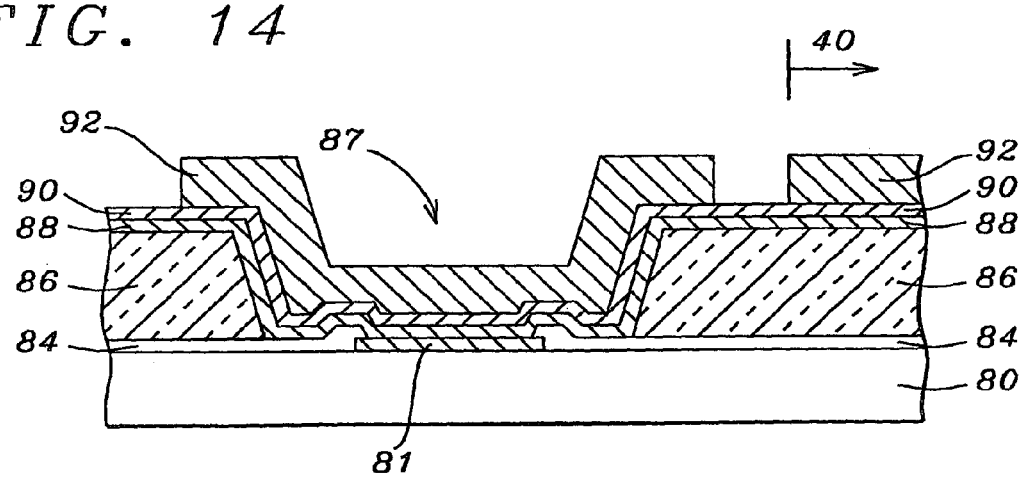
Figure 16:
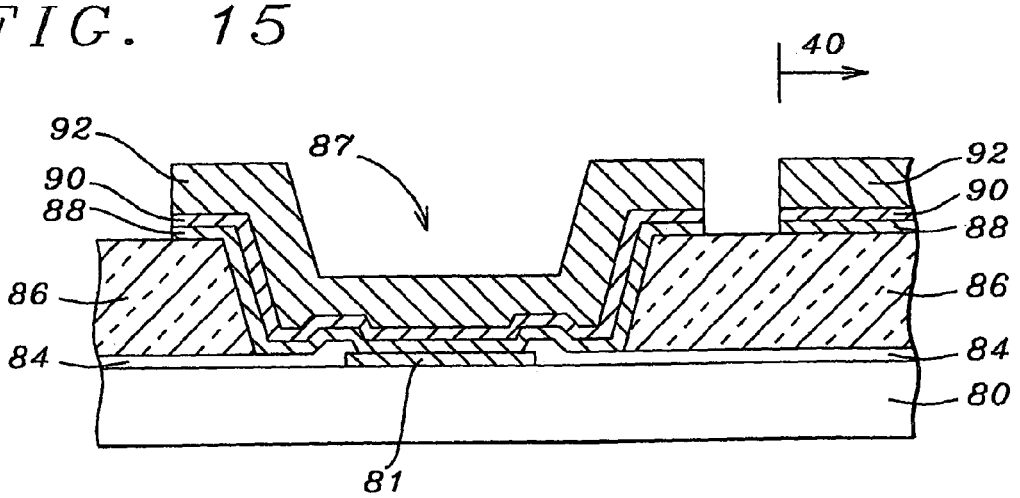

After electroplating, photoresist 94 is removed, as shown in FIG. 15. Glue/barrier Layer 88 and gold seed layer 90 are now removed, as shown in FIG. 16, by etching, using bulk Au layer 92 as a mask. One coil of inductor 40 is shown, but it would be understood that the complete inductor would be formed at the same time.

Figure 17:
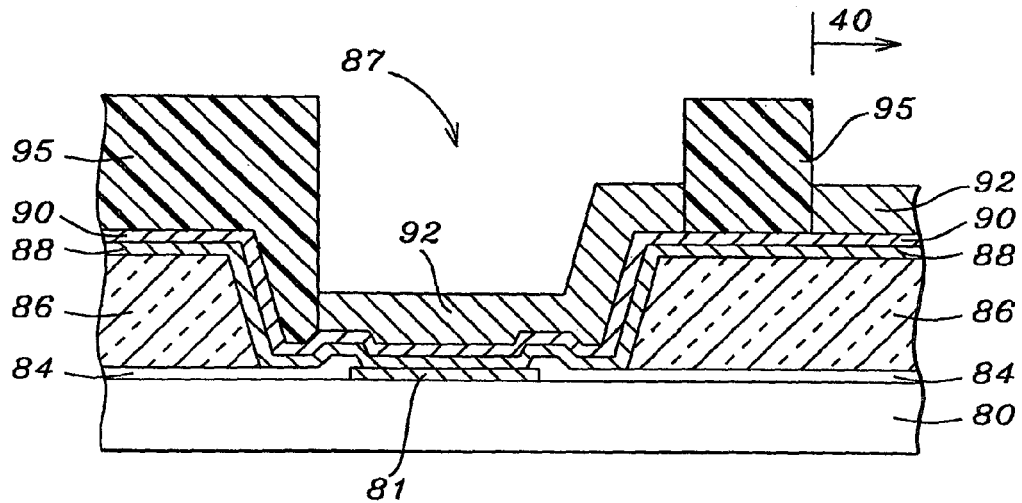
Figure 18:
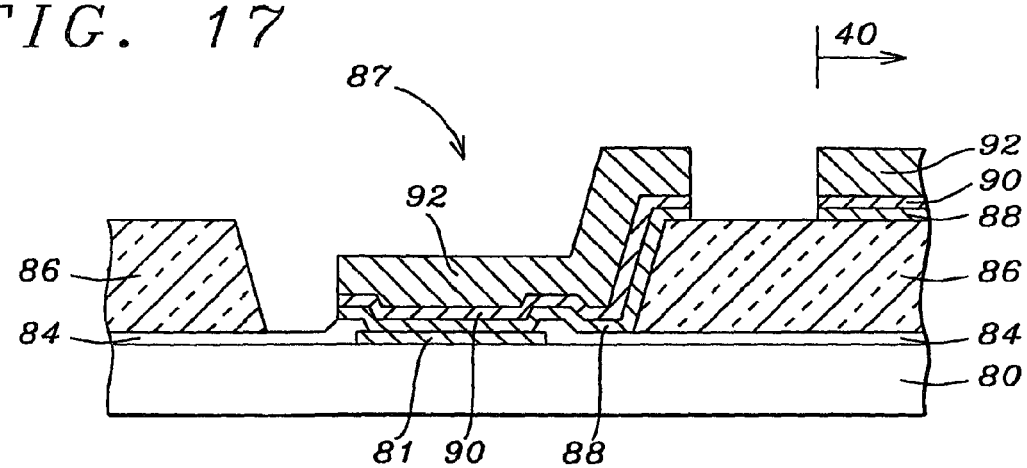

In another feature of the invention, polymer opening 87 may be only partially filled, as shown in FIGS. 17-18, which provides tight design rules for fine-pitch inductors. The design rule of polymer opening 87 is typically about 15 micrometers, while the metal traces of inductor are as tight as a 4 micrometers pitch. Therefore, patterning metal inside the polyimide opening is a very important feature of this technology.

Glue/barrier layer 88 and Au seed layer 90 are sputtered as previously described, and photoresist 95 formed as shown in FIG. 17, followed by electroplating gold bulk layer 92. Photoresist 95 is then stripped, and the seed layer and glue/barrier etched as previously described, and as shown in FIG. 18.

In another embodiment of the invention, copper may be used as the bulk metal in the post-passivation metallization scheme. The FIG. 13 structure is a starting point.

Figure 19:
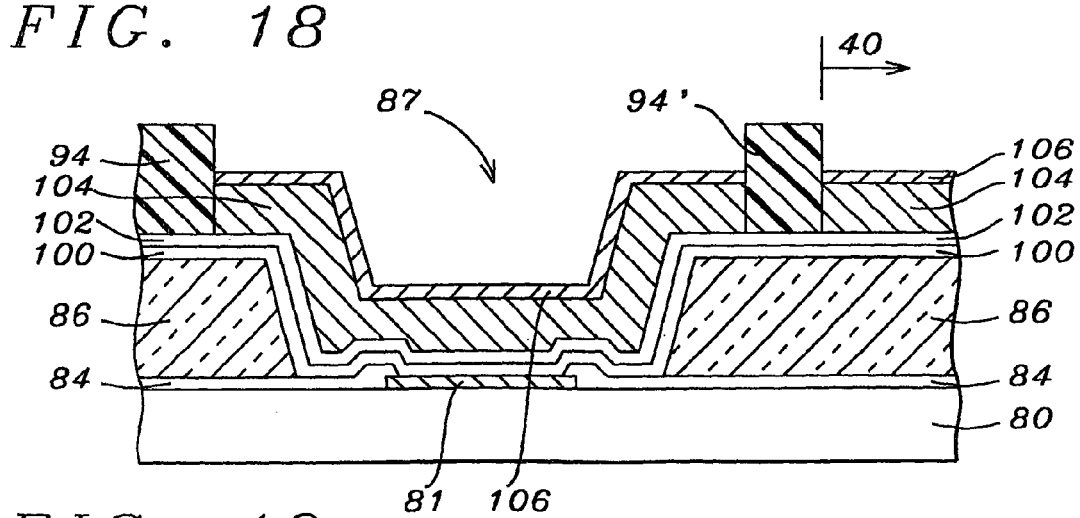
FIGS. 19-23 depict the creation of copper metal structures of the invention, through a layer of polymer.

Next, as shown in FIG. 19, a glue/barrier layer 100 of Cr or Ti is sputter deposited to a thickness of between about 200 and 2000 Angstroms. Next, a Cu seed layer 102 is sputter deposited to a thickness of between about 2,000 and 10,000 Angstroms. Bulk layer 104 of Cu is next electroplated to a thickness of between about 3 and 20 also using a photoresist 94' and conventional lithography to define the areas to be electroplated. Finally, an optional cap layer 106 comprising Ni may also be formed, also by electroplating, to a thickness of between about 0.1 and 3 micrometers.

Figure 20:
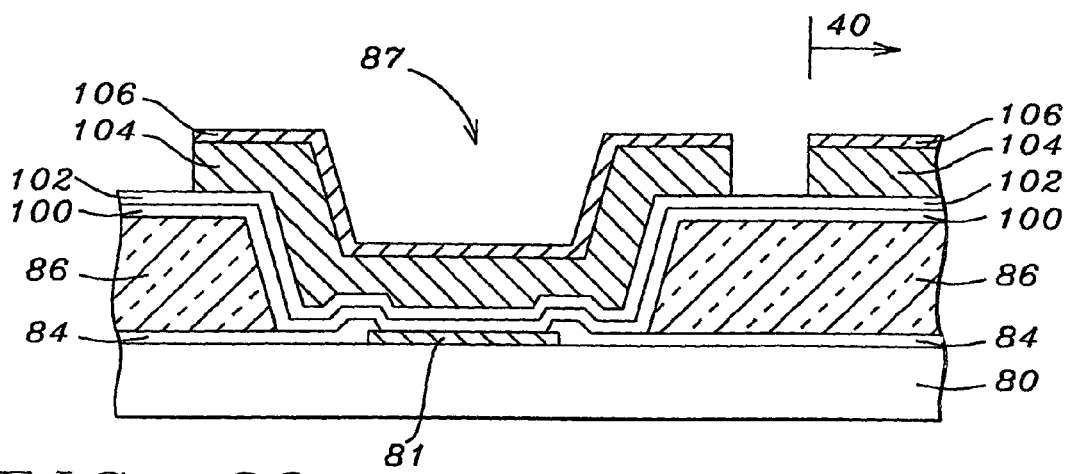
Figure 21:
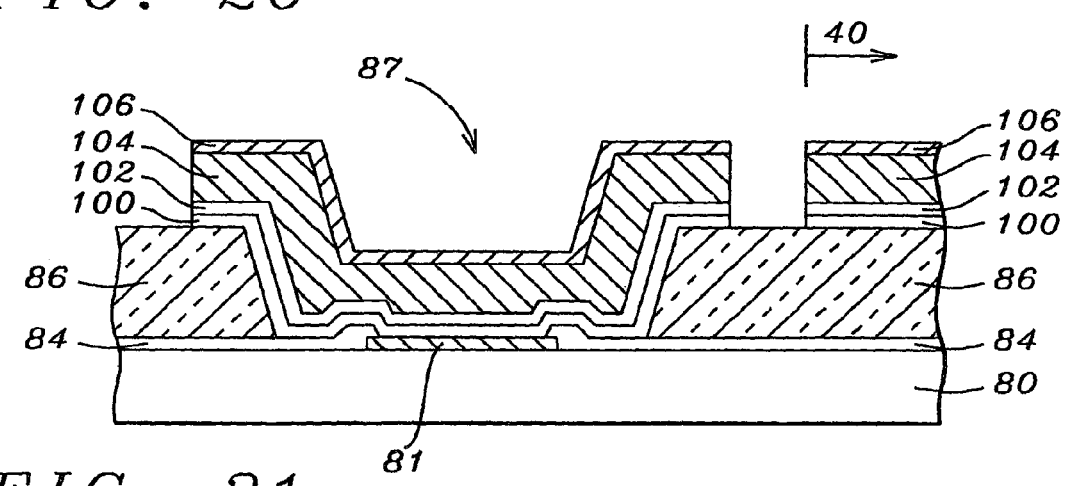

Referring to FIG. 20, photoresist 94' is stripped, exposing Cu seed layer 102. Glue/barrier layer 100 and Cu seed layer 102 are now removed, as shown in FIG. 21, by etching. The bulk Cu layer 104 is used as a mask for this etch.

If optional Ni cap layer 106 is used, it acts as an etch stop during the etching of glue/barrier 100 and seed layer 102. With the Ni cap, a faster Cu etch recipe can be used for removing the seed layer 102 since there is no loss of Cu bulk layer 104 in this configuration.

One coil of inductor 40 is shown, but it would be understood that the complete inductor would be formed at the same time.

Figure 22:
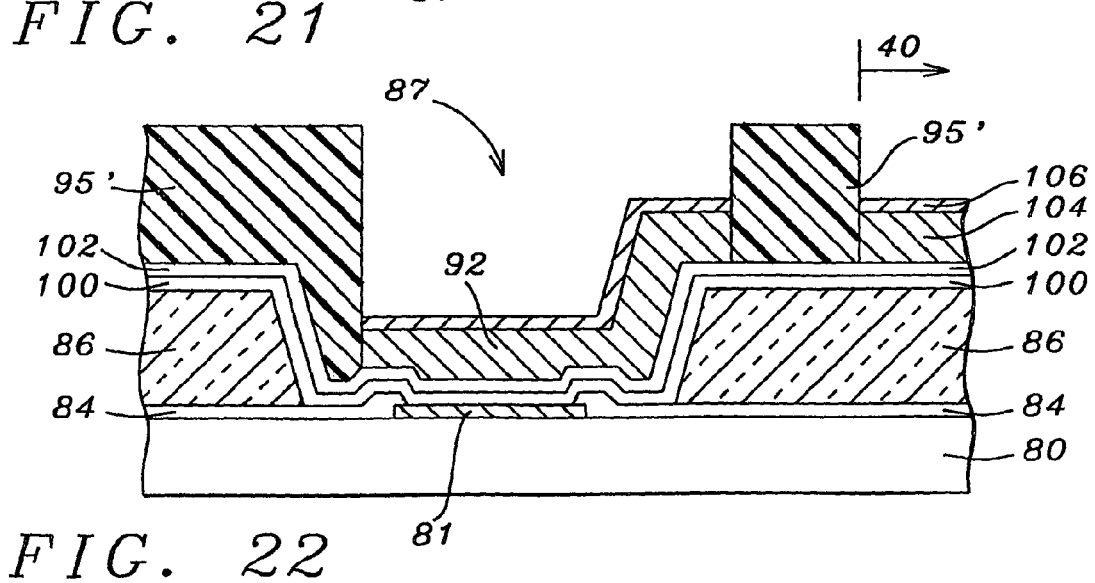
Figure 23:
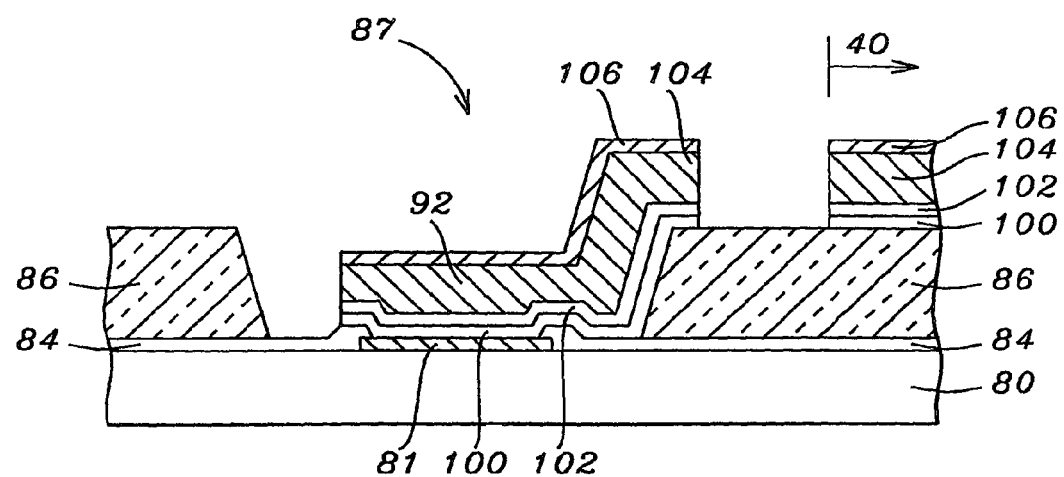

In another feature of the invention and as earlier described, polymer opening 87 may be only partially filled, as shown in FIGS. 22-23. Glue/barrier layer 100 and Cu seed layer 102 are sputtered as previously described, and photoresist 95' formed as shown in FIG. 22, followed by electroplating Cu bulk layer 104 and Ni 106. Photoresist 95' is then stripped, and the seed layer and glue/barrier etched as previously described, and as shown in FIG. 23.

Figure 5A:
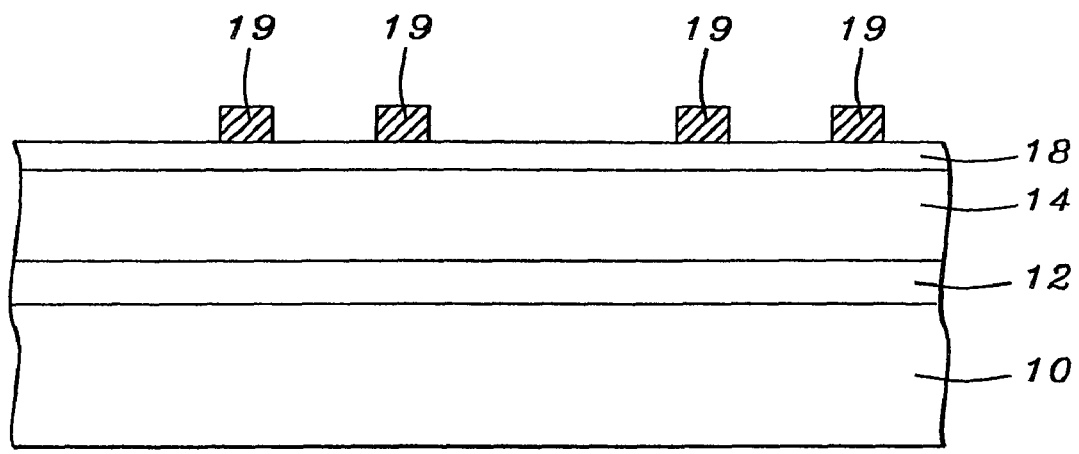
FIG. 5a shows an inductor of the invention above a layer of passivation.

Referring now to FIG. 5a, layers similar to earlier descriptions are shown whereby in this case no layer of polyimide has been deposited over the layer of passivation. An inductor 19 has been created on the surface of layer 18 of passivation. The ohmic resistivity of the metal that is used for inductor 19 must be as low as possible. For this reason, the use of a thick layer of, for instance, gold is preferred for the formation of inductor 19. It has been shown that a thick layer of gold increased the Q value of inductor 19 from about 5 to about 20 for 2.4 GHz applications.

The FIG. 5a inductor may be connected to other elements in various configurations, as earlier described. These include both terminals being connected to lower levels, as shown in FIG. 4, one up and one down as shown in FIG. 24a, or both up as in FIG. 24b.

An additional layer of polymer (not shown) may optionally be formed over inductor 19.

Figure 5B:
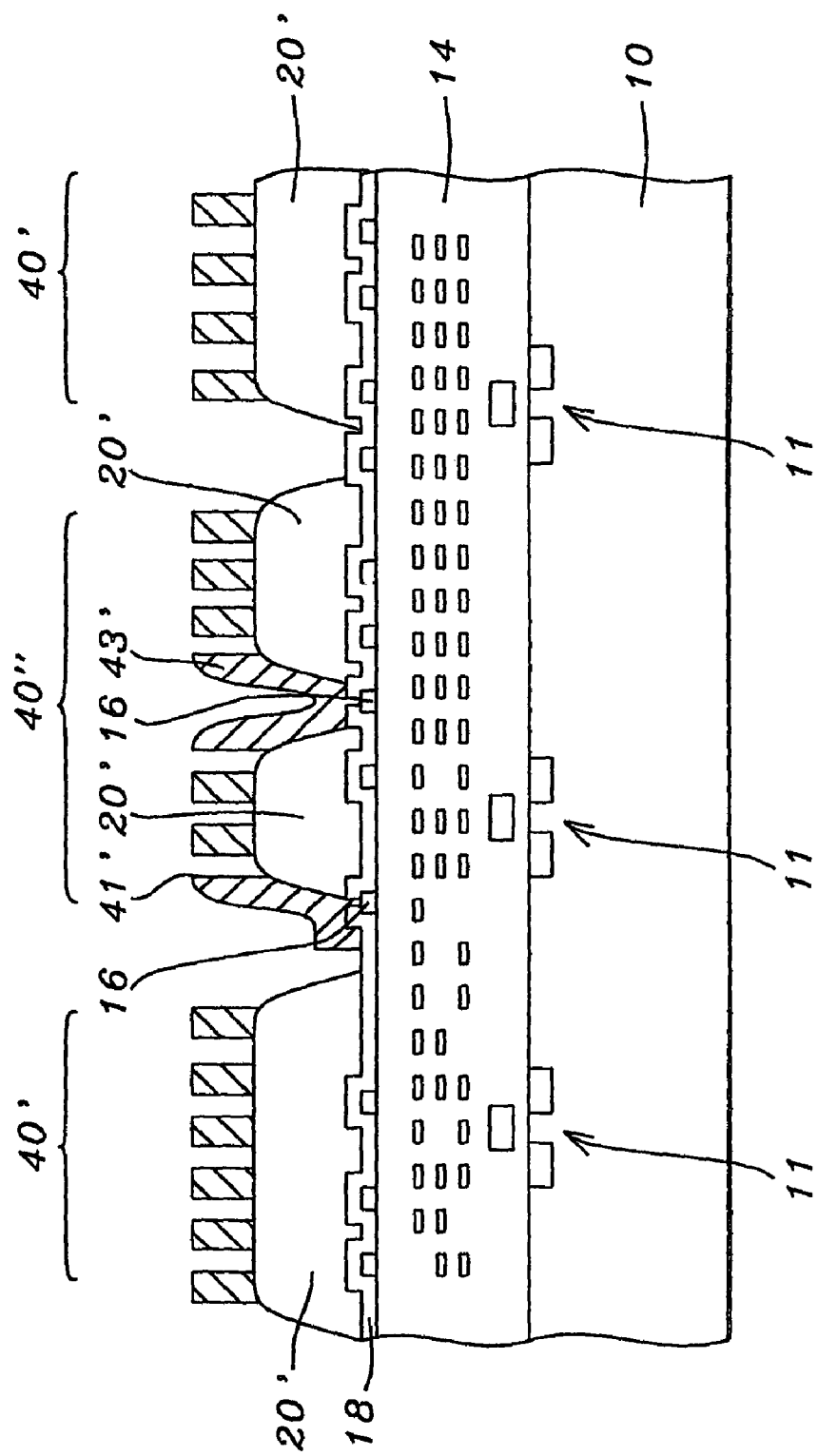

In another feature of the invention, polymer islands may be formed only under the inductor coils, and not elsewhere over the passivation layer, in order to reduce the stress caused by a larger sheet of polymer. This is depicted in FIGS. 5b-5c, which are a cross-sectional representation, and top view, respectively, of inductors of the invention formed on polymer islands. Each island may contain one or more than one inductor, such as on the right-most island of FIG. 5c having a first inductor 40' and second inductor 40'''.

Referring first to FIG. 5b, isolated islands of polymer 20' are formed by depositing a polymer layer and then patterning the polymer layer to form the polymer islands. The polymer islands may also be formed by screen printing, or by dry film lamination. The islands of polymer 20' are formed only at the location of inductors 40' and 40'', which are formed subsequent to polymer island formation.

The inductors 40' and 40'' of FIG. 5b are formed as earlier described. For illustrative purposes, inductor 40'' is shown with downward contacts 41' and 43' connecting to metal contact points 16. Inductors 40' are shown without contacts but could be connected upward for connection to external circuits, as described elsewhere.

FIG. 5c is a top view of the inductors of the invention shown in FIG. 5b, in which the FIG. 5b cross-section is taken along line 5b-5b in FIG. 5c. It can be seen in FIG. 5c that polymer islands 20' are isolated from one another, and polymer is only located under inductor locations-passivation layer 18 is exposed in all other areas of the substrate.

An additional protective layer of polymer (not shown) may optionally be formed over inductors 40' and 40''.

In a similar fashion to that shown in FIGS. 5b-5c for inductors, polymer islands may be formed under other devices of the invention, including passive devices such as resistors and capacitors.

Figure 6A:
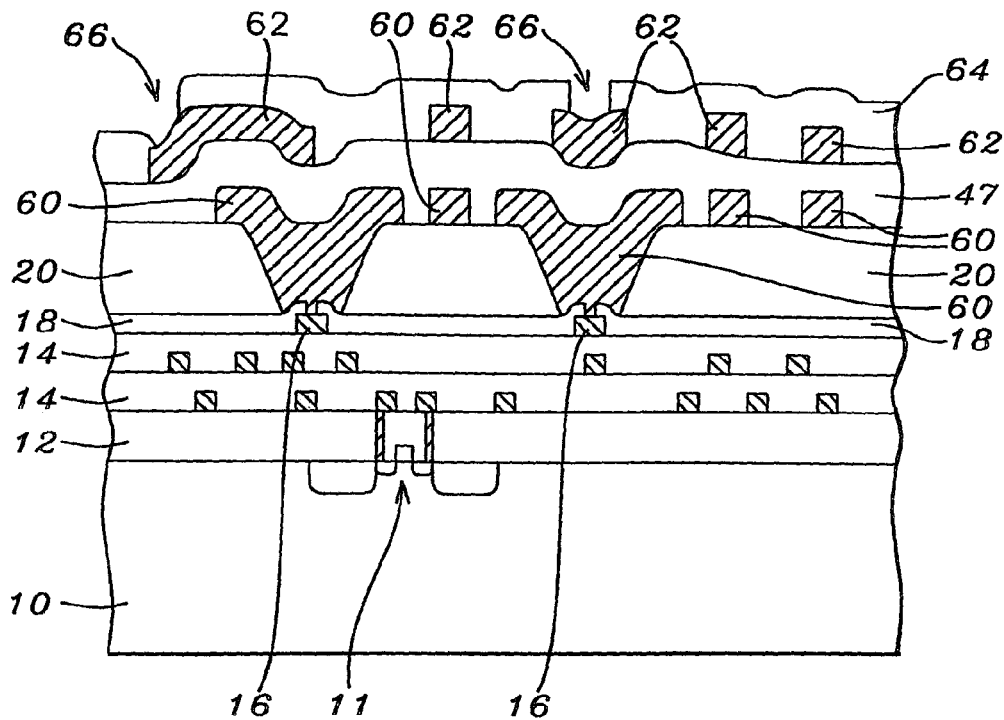
FIG. 6a is a cross sectional representation of a transformer according to the invention, formed over a polymer layer, over a layer of passivation.
Figure 6B:
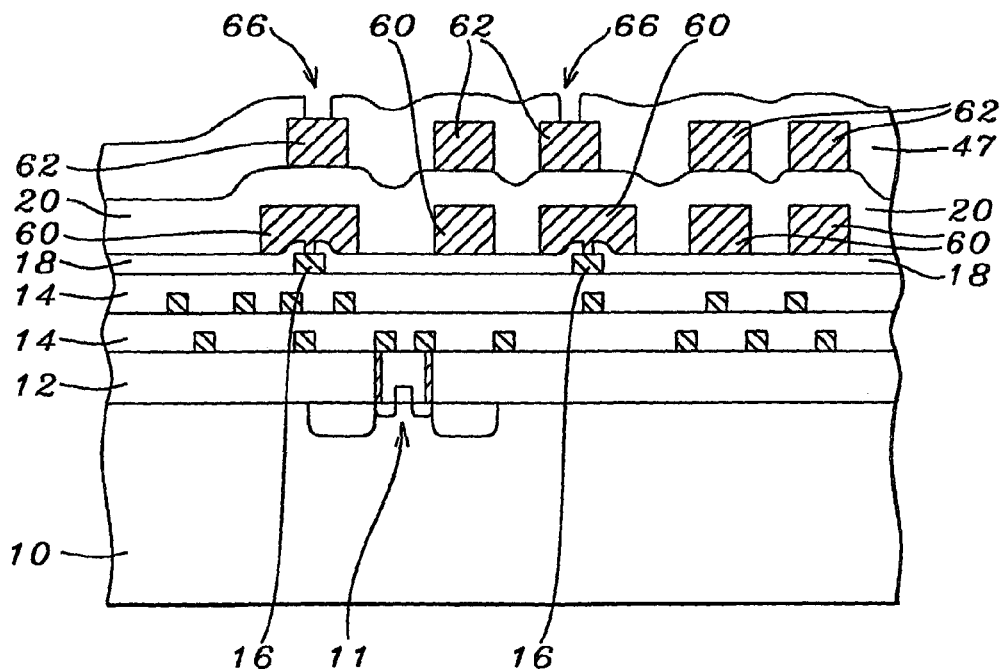
FIG. 6b is a cross sectional representation of a transformer according to the invention, with the bottom coil formed on a layer of passivation.

101061 FIGS. 6a-6b depict a transformer made according to the invention. The transformer consists of bottom coil 60, and top coil 62, isolated by a dielectric layer 47. Polymer layers 20, 47 and 64 are formed, and comprise materials, previously described. Openings 66 are provided in top polymer layer 64 for connections to the top coil 62.

FIG. 6b is a cross-sectional representation of a transformer of the invention, in which the bottom coil 60 is formed directly on passivation layer 18.

Figure 6C:
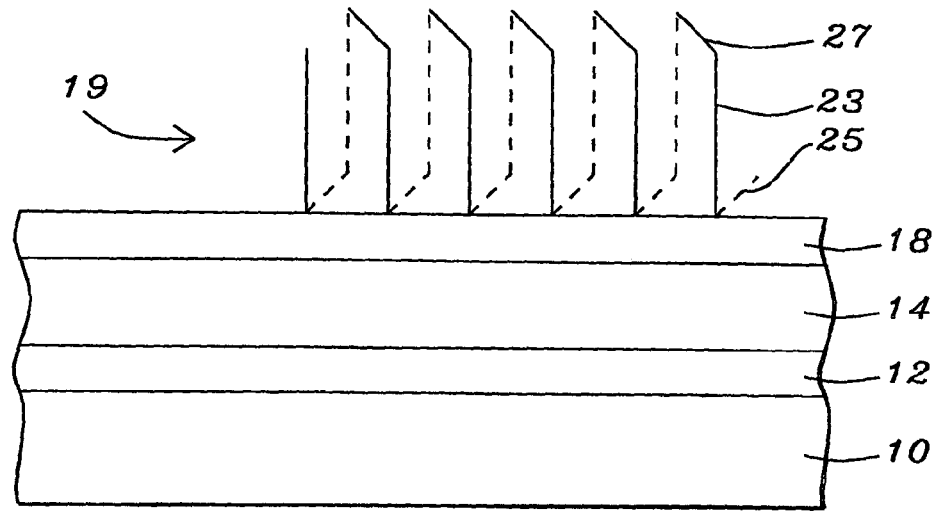
FIG. 6c is a three dimensional view of another embodiment of a solenoidal inductor of the invention, over a passivation layer.

FIG. 6c is a three-dimensional view of a solenoid structure of an inductor 19 that has been created on passivation layer 18, according to the invention. Further highlighted in FIG. 6c are:

23, vias that are created in the thick layer of polymer 20, having substantially vertical metal segments 25, the bottom metal segments of the solenoid 27, the top metal segments of the solenoid.

The top and bottom metal segments 25, 2727, 25 are connected, as shown, by the substantially vertical metal segments formed in vias 23, to form a continuous solenoid.

Figure 6D:
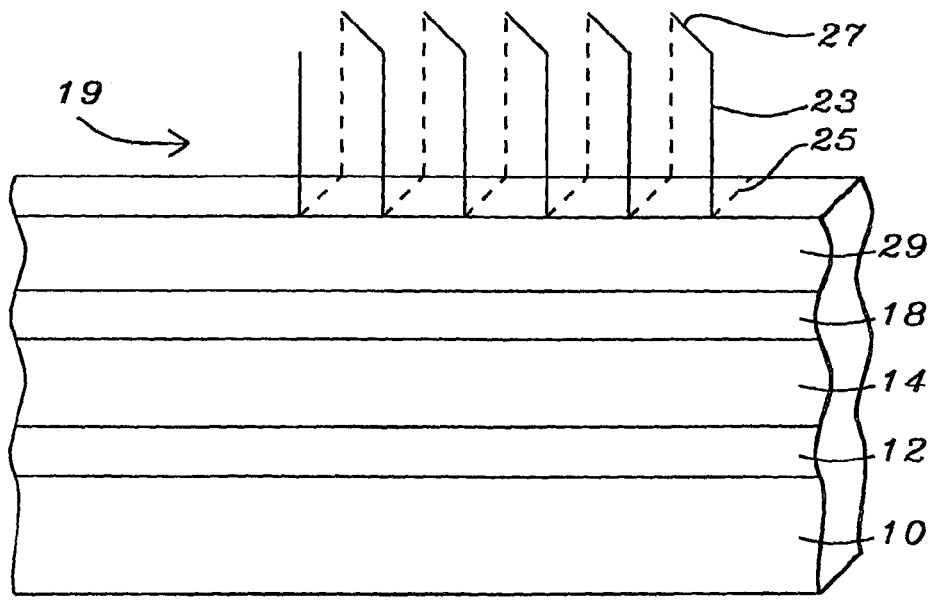
FIG. 6d is a three-dimensional view of a solenoidal inductor of the invention, formed over a polymer layer, over a passivation layer.

FIG. 6d is a three dimensional view of a solenoid that has been created on a first layer 29 of polymer, having vias 23 created in a second layer of polymer.

Figure 6E:
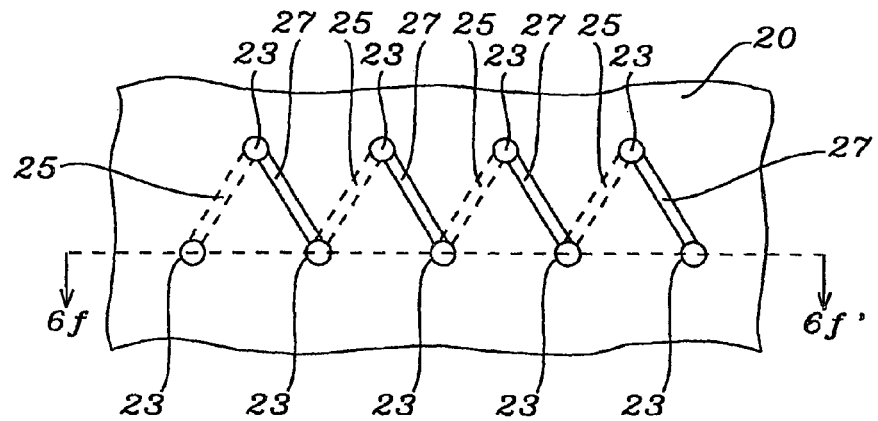
FIG. 6e is a top view of the inductors of FIGS. 6c and 6d.

FIG. 6e is a top view of the solenoid of FIGS. 6c and 6d. Vias 23 are shown, connecting top metal segments 27 to bottom metal segments 25.

Figure 6F:
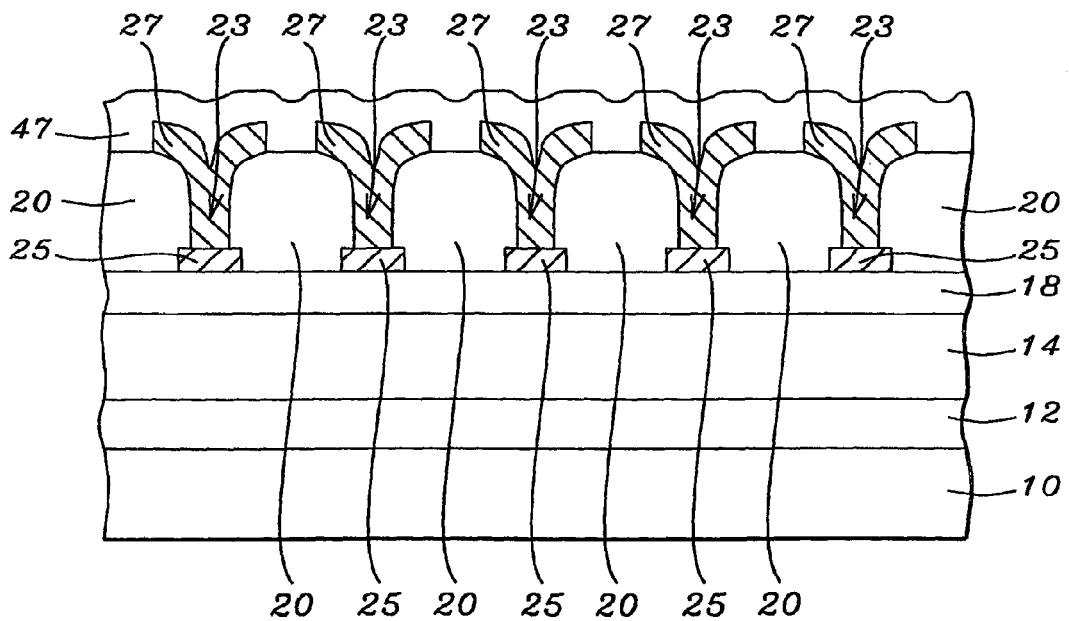
FIG. 6f is a cross sectional representation of the structure of FIG. 6e, taken along the line 6f-6f of FIG. 6e.

FIG. 6f is a cross section of the structure of FIGS. 6c-6e, taken along line 6f-6f of FIG. 6e.

Figure 6G:
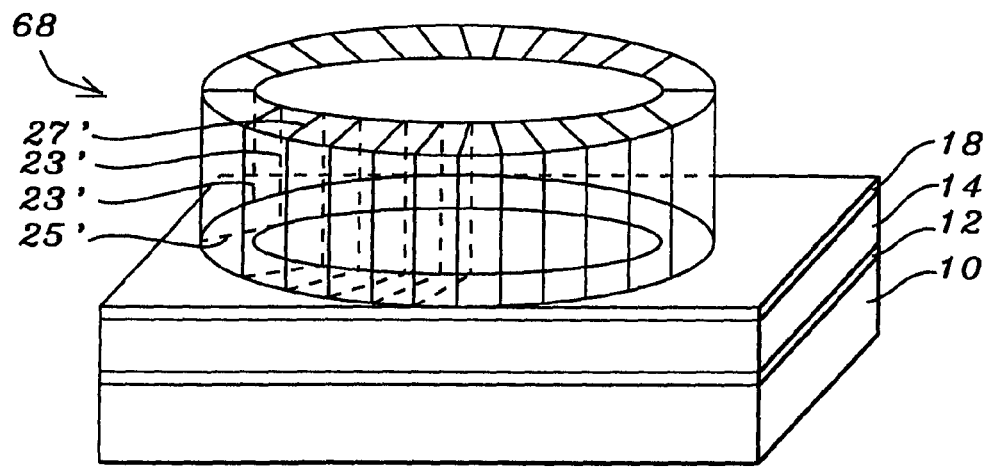
FIG. 6g is a three dimensional view of an inductor of the invention, in the shape of a toroid.
Figure 6H:
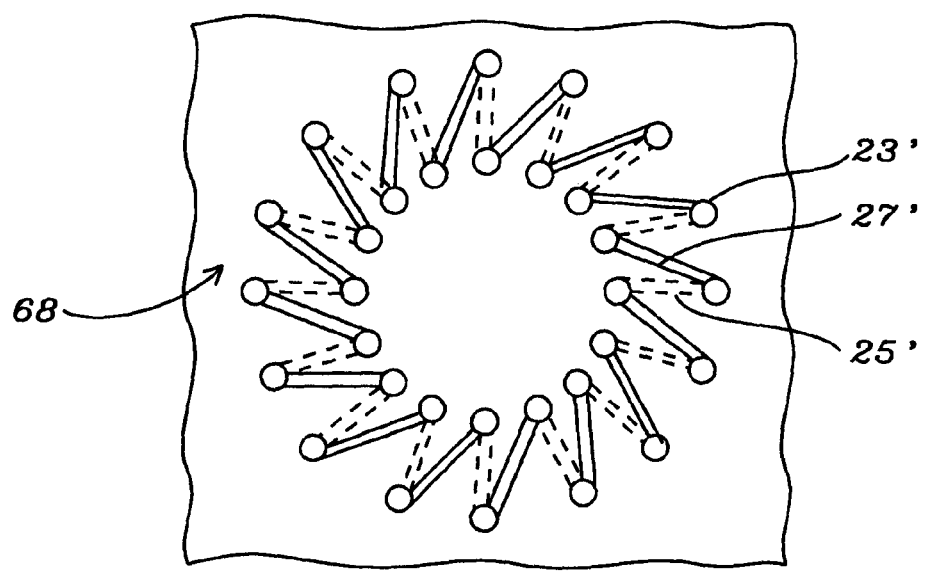
FIG. 6h is a top view of the toroidal inductor of FIG. 6g.

Referring now to FIGS. 6g-6h, a toroidal inductor 68 is shown, also formed according to the method and structure of the invention. In FIG. 6g, a three-dimensional view is shown, including top metal wires 27', with vias 23' connecting the top metal wires to the bottom metal wires 25'.

FIG. 6h shows, for further clarification, a top view of the toroidal inductor 68 of FIG. 6g. The highlighted features of this figure have previously been explained and therefore do not need to be further discussed at this time.

Besides inductors, it is very useful to form other passive devices, such as capacitors and resistors, using the method and structure of the invention.

Figure 7A:
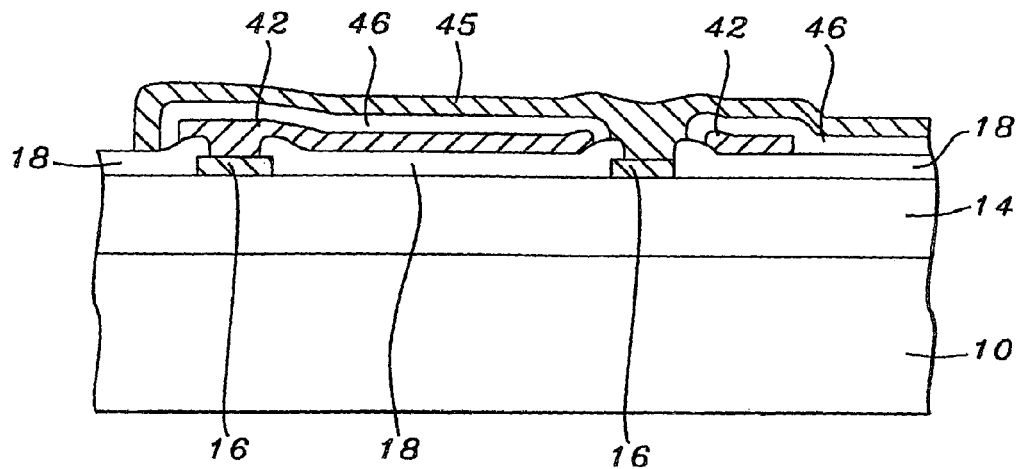
FIGS. 7a-7c is a cross sectional representation of a capacitor of the invention, formed over a polymer layer over passivation.

FIG. 7a is a cross section of a capacitor that has been created over a substrate 10. A layer (or layers) 14 of conductive interconnect lines and contact points 16 have been created over substrate 10. A layer 18 of passivation has been deposited over layer 14, with openings created in layer 18 of passivation through which contact pads 16 can be accessed.

A capacitor contains, as is well known, a lower plate, an upper plate and a layer of dielectric that separates the upper plate from the lower plate. FIG. 7a includes lower plate 42, upper plate 45, and dielectric layer 46. The upper and lower plates 45 and 42 are formed as earlier described, using electroplated Au or Cu for the bulk metals. An optional protective polymer, preferably polyimide, may be formed over the capacitor. Contacts to the capacitor may be made as described earlier for inductor terminals (both down, one up and one down, or both up).

Lower plate 42 is formed to a thickness of between about 0.5 and 20 μm. Layer 46 of dielectric is between about 500 and 50,000 Angstroms. Upper plate 45 is between about 0.5 and 20 μm thick.

The post-passivation capacitor shown in cross section in FIG. 7a has:

reduced parasitic capacitance between the capacitor and the underlying silicon substrate allowed for the use of a thick layer of conductive material for the capacitor plates, reducing the resistance of the capacitor; this is particularly important for wireless applications can use high-dielectric-constant material such as $TiO_2$ or $Ta_2O_5$, in addition to polymer, $Si_3N_4$ or $SiO_2$, for the dielectric between the upper and the lower plate of the capacitor, resulting in a higher capacitive value of the capacitor.

The capacitor of FIG. 7a may alternately be formed above a polymer layer (deposited over passivation 18), similar to the inductor of FIG. 4.

Dielectric layer 46 is formed of a high-K dielectric material such as $Si_3N_4$, TEOS, $Ta_2O_5$, $TiO_2$, $SrTiO_3$, or SiON, which are typically deposited by CVD (Chemical Vapor Deposition).

Alternately, the dielectric layer 46 can be a polymer film, including polyimide, benzocyclobutene (BCB), parylene or an epoxy-based material such as photoepoxy SU-8.

Figure 7B:
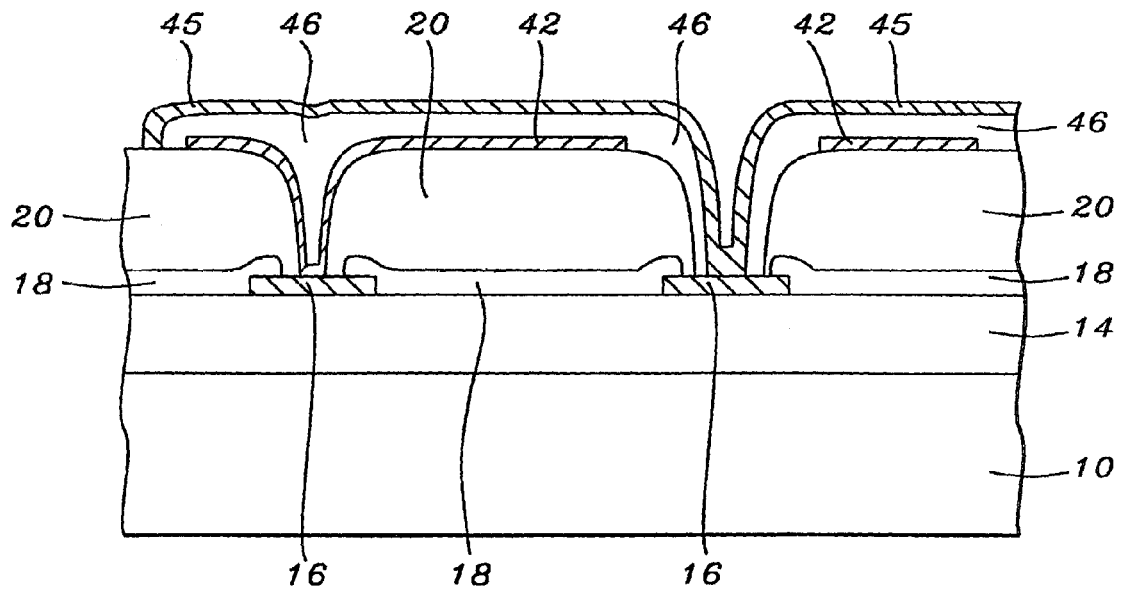
Figure 7C:
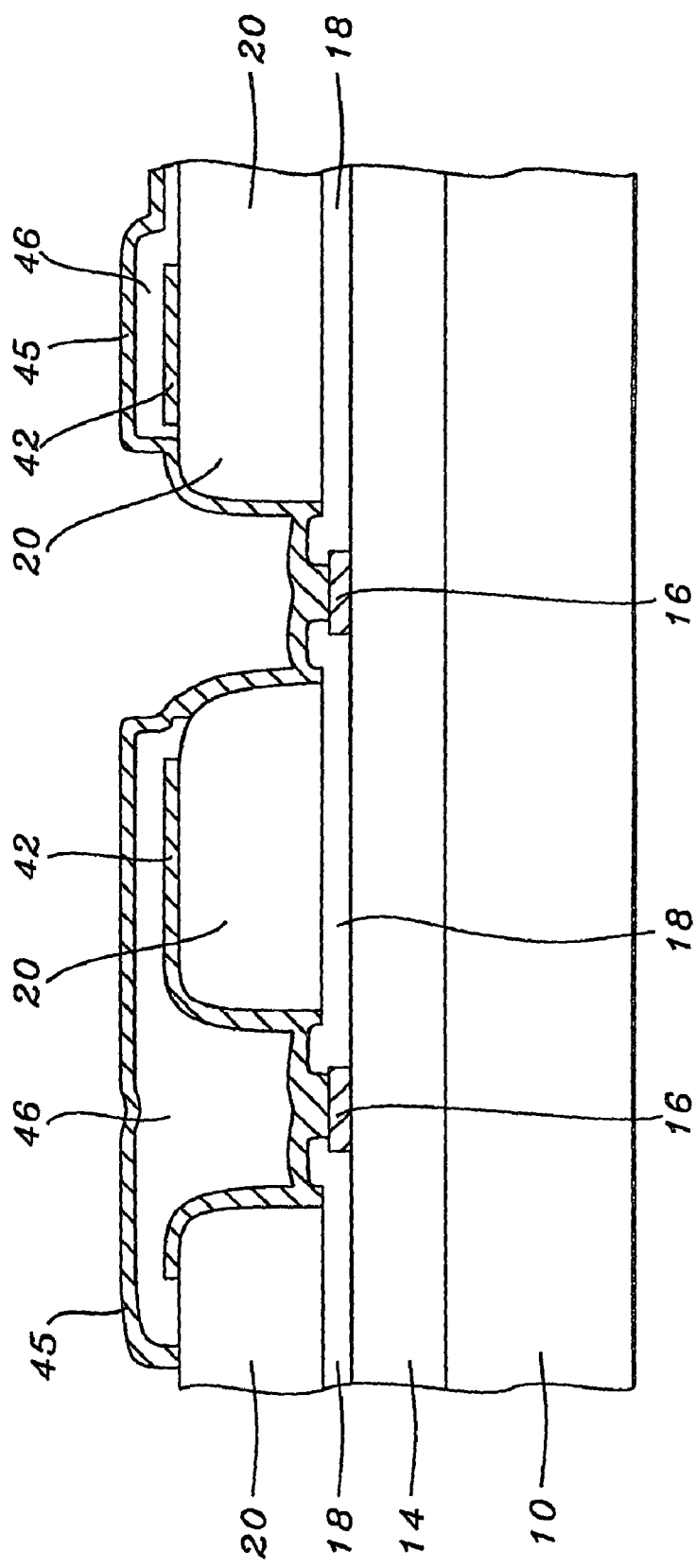

FIGS. 7b-7c show a cross section where, as in FIG. 7a, a capacitor is created. In the cross section that is shown in FIG. 7b a thick layer 20 of polymer has been deposited over the surface of the passivation layer 18 and has been patterned in order to make the contact pads 16 accessible though the thick layer 20 of polymer. FIG. 7b shows the polymer vias having a smaller via diameter than the vias created through the layer of passivation. It is however preferred, as shown in FIG. 7c, that larger vias be used in conjunction with smaller passivation vias. The thick layer 20 of polymer moves most of the capacitor, that is the lower plate 42, the upper plate 45 and the dielectric 46, further from the surface of substrate 10 by a distance equal to the thickness of layer 20. It has previously been stated that the range of polyimide thickness can vary from 2 μm to 150 μm, depending on electrical design requirements. This leads to a significant increase in distance between the capacitor and underlying structures, including metal lines and/or the silicon substrate, so that parasitic capacitance is significantly reduced.

Figure 25:
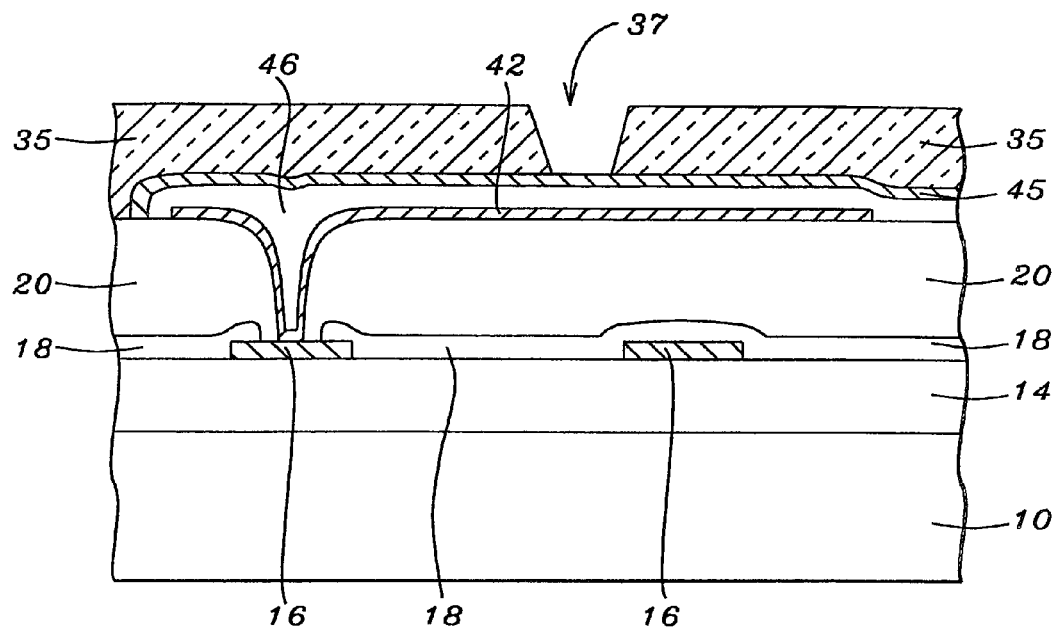
FIGS. 25 and 26 show extended methods of connecting a capacitor and a resistor under the invention.

FIGS. 7a-7c depict both capacitor terminals being connected down to a lower layer. The capacitor may also be contacted in one-up-one-down configuration--as shown in FIG. 25--or a two-up technique, as previously described with reference to FIG. 24b.

Specifically relating to the cross section of FIGS. 7a-7c, the upper capacitor plate 45 can be connected in an upward manner through a layer of dielectric that has been deposited over the upper capacitor plate 45 of FIGS. 7a-7c. This is further highlighted in the cross section of FIG. 25, wherein a layer 35 of dielectric has been deposited over the capacitor upper plate 45, with an opening 37 created through the layer 35 of dielectric to expose the capacitor upper plate 45, for further connection to external circuits.

The capacitor of FIGS. 7a-7c may optionally be covered with a protective layer of polymer, as previously described.

Figure 8:
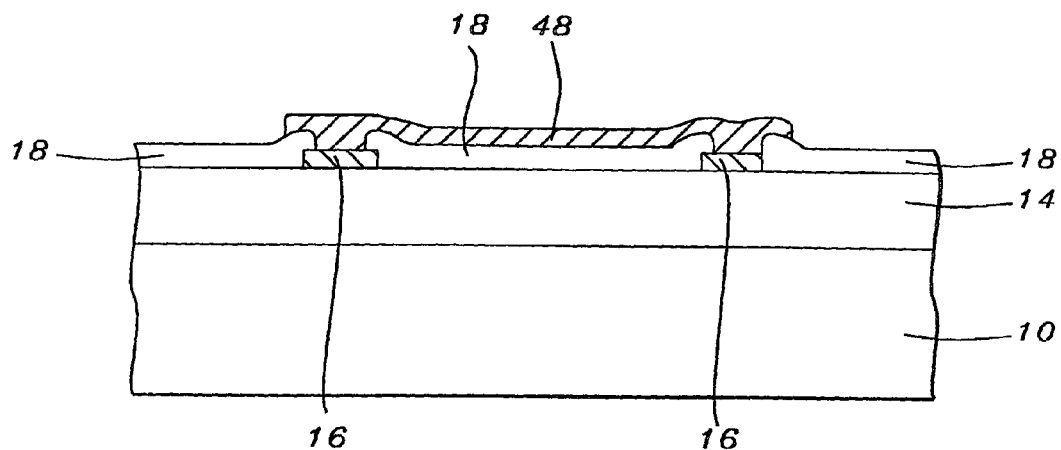
FIG. 8 is a cross sectional representation of a resistor of the invention, formed over a passivation layer.

FIG. 8 shows a cross section of a substrate 10 over which has been deposited a layer 18 of passivation, with a resistor 48 formed over passivation layer 18. A resistor, as is well known, is created by connecting two points with a material that offers electrical resistance to the passage of current through the material. For the creation of layer 48 a resistive material is used, such as TaN, NiCr, NiSn, tungsten (W), TiW, TiN, Cr, Ti, TaSi or Ni. Among these resistive materials, NiCr provides the best TCR (Temperature Coefficient of Resistance), which can be as small as 5 ppm/.degree. C. Resistor dimensions such as thickness, length and width of deposition of high resistive material are application dependent. The resistor 48 that is shown in cross section in FIG. 8 is, as are the capacitors of FIGS. 7a-7c, created in a post-passivation process on the surface of layer 18 of passivation.

Figure 9A:
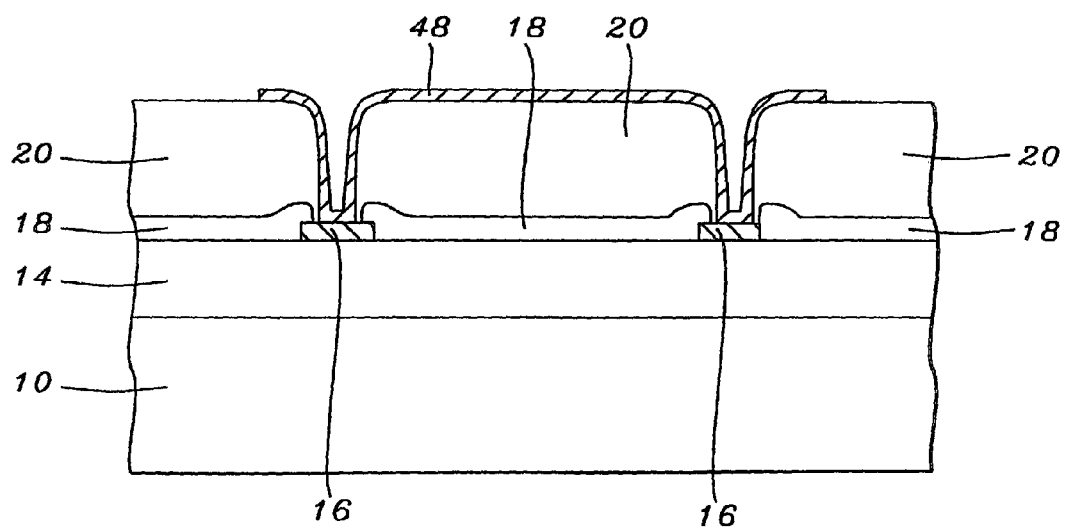
FIGS. 9a-9b are cross sectional representations of a resistor of the invention, formed over a thick polymer layer, over a passivation layer.
Figure 9B:
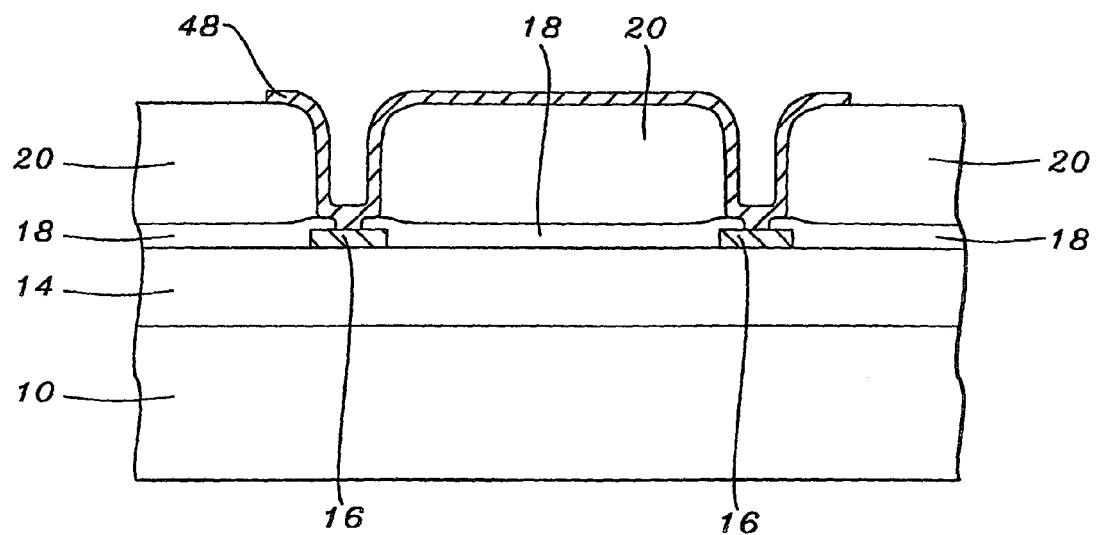

FIGS. 9a-9b shows the resistor of the invention formed over a thick layer of polymer 20, connected to contact pads 16. By increasing the distance between the body of the resistor and the substrate (by the thickness of the polymer layer 20 and other intervening layers) the parasitic capacitance between the body of the resistor and the substrate is reduced, resulting in an improved resistive component (reduced parasitic capacitive loss, improved high frequency performance).

Figure 26:
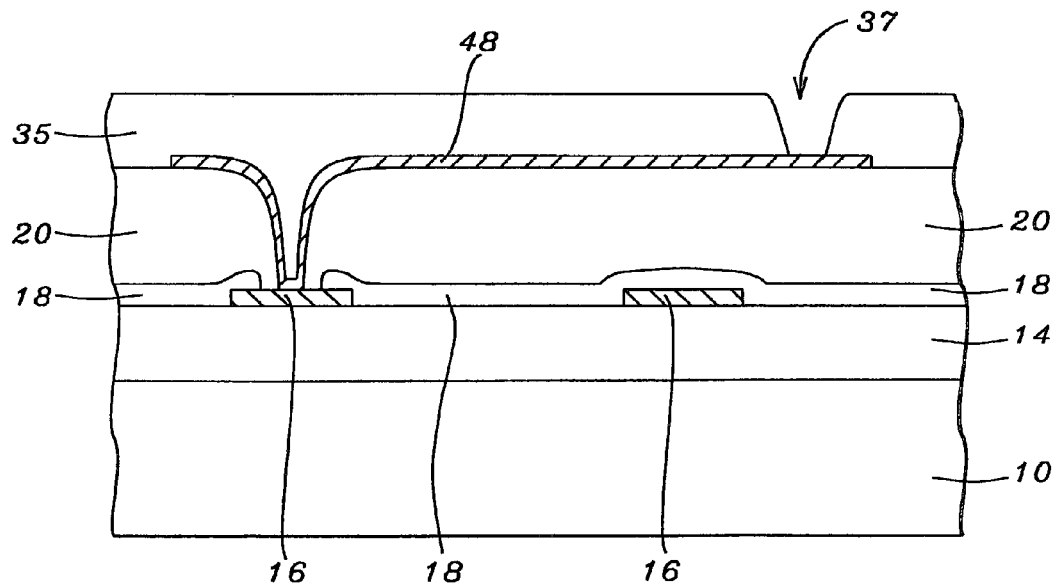

FIGS. 8, 9a and 9b show a "two-down" system for contacting the terminals of the resistor 48. The resistor may also be contacted in one-up-one-down configuration, as shown in FIG. 26, or a two-up technique, as previously described with reference to the inductor of FIG. 24b.

An additional layer of polymer (not shown), to protect the resistor, may optionally be formed over the resistor 48 of FIGS. 8, 9a and 9b.

Figure 10:
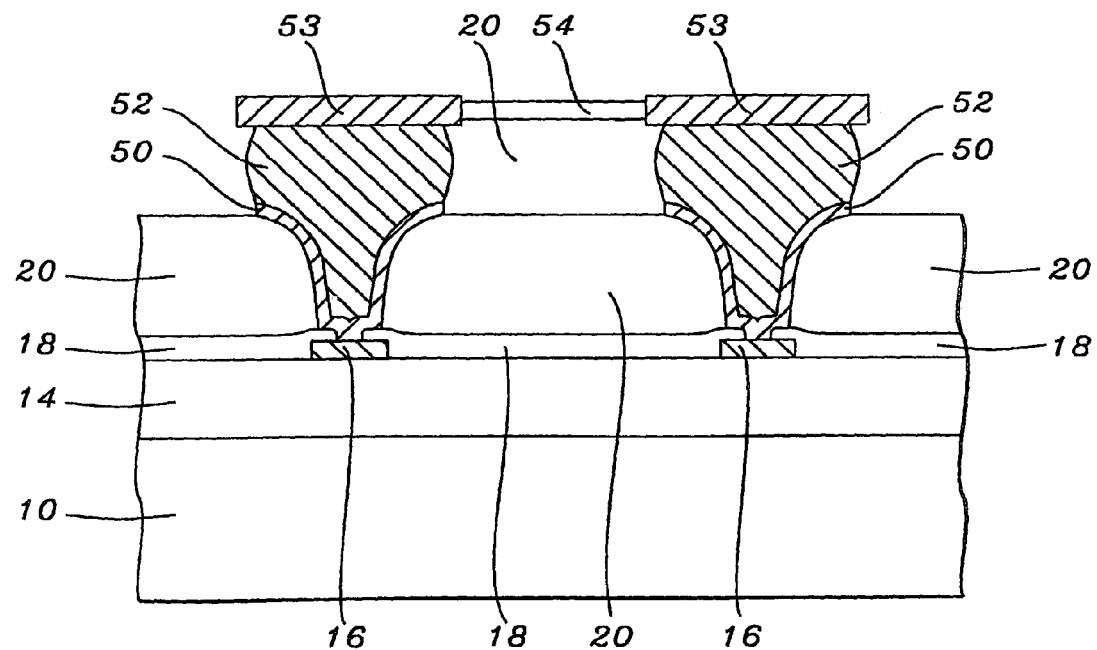
FIG. 10 is a cross sectional representation of a silicon substrate over which a discrete electrical component has been mounted, on the top of a thick polymer layer, using surface mount technology.
Figure 11:
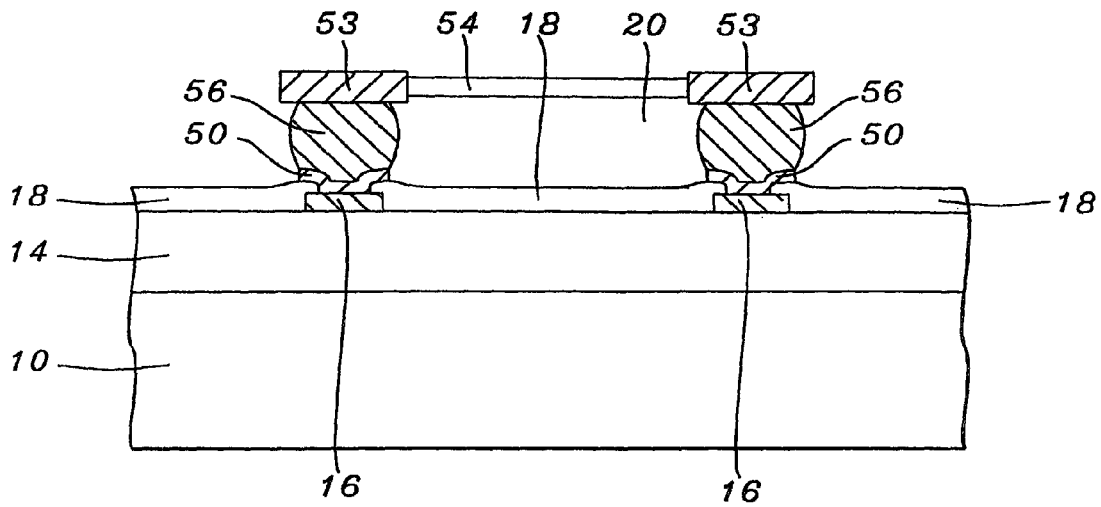
FIG. 11 is a cross sectional representation of a silicon substrate, having a passivation layer on the surface of which a discrete electrical component has been mounted, using surface mount technology.

Further applications of the post-passivation processing of the invention are shown in FIGS. 10 and 11, which concentrate on making contact points between contact pads 16 and an overlying electric component, such as a discrete inductor, capacitor, resistor or other passive device. Interconnect metal 50 of the invention is formed in polymer openings, as previously described, which are aligned with smaller passivation openings, to connect to pads 16, and serves as an under-bump metal (UBM). Solder contact bumps are formed over UBM 50 using conventional methods of selective solder deposition (plating, ball mounting, or screen printing on the surface of contacts 50), the application of a flux on the deposited solder and flowing the solder. A discrete device 54 is connected to solder balls 52 and has solder 53 to facilitate the connection. This is similar to the surface mount technology used in the assembly of printed circuit boards. The discrete electrical component may be, but is not limited to, devices such as inductors, capacitors or resistors.

FIG. 11 illustrates mounting of discrete device 54, using solder bumps 56, and UBM 50, directly over passivation layer 18.

The discrete components of FIGS. 10 and 11 have the advantages of performance and cost savings since the discrete component does not have to be mounted on a Printed Circuit Board as is the common practice in the art.

UBM 50 is formed using the metallization scheme of the invention (as shown and described with respect to FIGS. 12-23), except that when Au is used as the bulk layer, its thickness is in the range of between about 0.1 and 20 micrometers, the thinner range being preferable to avoid a high gold concentration in the solder near the UBM/solder interface, after processing.

The invention and its various features provide the advantages of:

the discrete components provide optimized parameters and can be mounted close to the circuits, which offer true system-on-chip performance the discrete components mounting close to the circuits also minimizes parasitics the post-passivation process of the invention allows for the selection of discrete component design parameters that result in reduced resistance of the discrete capacitor and the discrete inductor.

The advantages of the invention will be further clarified by the following comparison between prior art processes and the processes of the invention. Prior approaches in the art uses thinner metal for inductors, requiring wider coils (to minimize resistance), resulting in increased surface area, increasing the parasitic capacitance of the inductor and causing eddy current losses in the surface of the substrate.

The present invention, by contrast, can use easily formed thick metal layers, the thickness reducing resistance. Use of polymer 20 further separates the inductor or other component from underlying structures, reducing capacitance. With the reduced capacitance, a higher frequency of operation results due to a higher resonant frequency.

Although the preferred embodiment of the present invention has been illustrated, and that form has been described in detail, it will be readily understood by those skilled in the art that various modifications may be made therein without departing from the spirit of the invention or from the scope of the appended claims.

The invention claimed is:

1. A method of forming an integrated circuit chip, comprising:
providing a silicon substrate, a transistor in and on said silicon substrate, a first metallization structure over said silicon substrate, wherein said first metallization structure comprises a first metal layer and a second metal layer over said first metal layer, a dielectric layer between said first and second metal layers, and a passivation layer over said silicon substrate, over said first metallization structure and over said dielectric layer, wherein an opening in said passivation layer is over a contact point of said first metallization structure, and said contact point is at a bottom of said opening in said passivation layer, wherein said passivation layer comprises a nitride;
forming a second metallization structure on said contact point and over said passivation layer, wherein said forming said second metallization structure comprises forming a glue layer, next forming a seed layer on said glue layer, next forming a photoresist layer on said seed layer, wherein an opening in said photoresist layer exposes a region of said seed layer, next electroplating a first copper layer on said region, next forming a nickel layer over said first copper layer in said opening in said photoresist layer, next removing said photoresist layer, and then removing said seed layer and said glue layer not under said first copper layer; and
mounting a discrete passive component over said second metallization structure, wherein said discrete passive component is connected to said contact point through said second metallization structure.

2. The method of claim 1, wherein said mounting said discrete passive component comprises mounting a discrete inductor over said second metallization structure.

3. The method of claim 1, wherein said mounting said discrete passive component comprises mounting a discrete capacitor over said second metallization structure.

4. The method of claim 1, wherein said mounting said discrete passive component comprises mounting a discrete resistor over said second metallization structure.

5. The method of claim 1, after said forming said second metallization structure, further comprising forming a solder on said second metallization structure, followed by said mounting said discrete passive component further to said solder, wherein said discrete passive component is connected to said second metallization structure through said solder.

6. The method of claim 1, after said forming said second metallization structure, further comprising screen printing a solder on said second metallization structure, followed by said mounting said discrete passive component further to said solder, wherein said discrete passive component is connected to said second metallization structure through said solder.

7. The method of claim 1, wherein said forming said glue layer comprises sputtering a titanium-containing layer.

8. The method of claim 1 further comprising said electroplating said first copper layer with a thickness between 3 and 20 micrometers.

9. The method of claim 1, wherein said forming said nickel layer comprises an electroplating process.

10. The method of claim 1, wherein said forming said glue layer comprises sputtering a titanium-tungsten-alloy layer.

11. The method of claim 1, wherein said forming said glue layer comprises sputtering a chromium-containing layer.

12. The method of claim 1, wherein said forming said seed layer comprises sputtering a second copper layer on said glue layer.

13. The method of claim 1 further comprising said forming said nickel layer with a thickness between 0.1 and 3 micrometers.

14. The method of claim 1 further comprising providing a layer of benzocyclobutene (BCB) on said passivation layer, wherein an opening in said layer of benzocyclobutene (BCB) is over said contact point.

15. The method of claim 1 further comprising providing a polymer layer on said passivation layer, wherein an opening in said polymer layer is over said contact point.

16. The method of claim 1 further comprising providing a layer of polyimide on said passivation layer, wherein an opening in said layer of polyimide is over said contact point.

17. The method of claim 1 further comprising providing a polymer layer with a thickness between 2 and 150 micrometers on said passivation layer, wherein an opening in said polymer layer is over said contact point.

18. A method of forming an integrated circuit chip, comprising:
providing a silicon substrate, a transistor in and on said silicon substrate, a first metallization structure over said silicon substrate, wherein said first metallization structure comprises a first metal layer and a second metal layer over said first metal layer, a dielectric layer between said first and second metal layers, and a passivation layer over said silicon substrate, over said first metallization structure and over said dielectric layer, wherein an opening in said passivation layer is over a contact point of said first metallization structure, and said contact point is at a bottom of said opening in said passivation layer, wherein said passivation layer comprises a nitride;
forming a second metallization structure connected to said contact point through said opening in said passivation layer, wherein said forming said second metallization structure comprises forming a third metal layer, next forming a photoresist layer on said third metal layer, wherein an opening in said photoresist layer exposes a region of said third metal layer, next forming a nickel layer over said region, next removing said photoresist layer, and then removing said third metal layer not under said nickel layer; and
mounting a discrete passive component over said second metallization structure, wherein said discrete passive component is connected to said contact point through said second metallization structure.

19. The method of claim 18, wherein said mounting said discrete passive component comprises mounting a discrete inductor over said second metallization structure.

20. The method of claim 18, wherein said mounting said discrete passive component comprises mounting a discrete capacitor over said second metallization structure.

21. The method of claim 18, after said forming said second metallization structure, further comprising forming a solder on said second metallization structure, followed by said mounting said discrete passive component further to said solder, wherein said discrete passive component is connected to said second metallization structure through said solder.

22. The method of claim 18, after said forming said second metallization structure, further comprising screen printing a solder on said second metallization structure, followed by said mounting said discrete passive component further to said solder, wherein said discrete passive component is connected to said second metallization structure through said solder.

23. The method of claim 18, wherein said forming said third metal layer comprises sputtering a titanium-containing layer.

24. The method of claim 18, wherein said forming said nickel layer comprises an electroplating process.

25. The method of claim 18, wherein said forming said third metal layer comprises sputtering a titanium-tungsten-alloy layer.

26. The method of claim 18, wherein said forming said third metal layer comprises sputtering a chromium-containing layer.

27. The method of claim 18, wherein said forming said third metal layer comprises sputtering a copper layer.

28. The method of claim 18 further comprising said forming said nickel layer with a thickness between 0.1 and 3 micrometers.

29. The method of claim 18 further comprising providing a polymer layer on said passivation layer, wherein an opening in said polymer layer is over said contact point.

30. The method of claim 18 further comprising providing a layer of polyimide on said passivation layer, wherein an opening in said layer of polyimide is over said contact point.

31. The method of claim 18 further comprising providing a polymer layer with a thickness between 2 and 150 micrometers on said passivation layer, wherein an opening in said polymer layer is over said contact point.

32. A method of forming an integrated circuit chip, comprising:
providing a silicon substrate, a transistor in and on said silicon substrate, a first metallization structure over said silicon substrate, wherein said first metallization structure comprises a first metal layer and a second metal layer over said first metal layer, a dielectric layer between said first and second metal layers, and a passivation layer over said silicon substrate, over said first metallization structure and over said dielectric layer, wherein an opening in said passivation layer is over a contact point of said first metallization structure, and said contact point is at a bottom of said opening in said passivation layer, wherein said passivation layer comprises a nitride;
forming a second metallization structure on said contact point and over said passivation layer, wherein said forming said second metallization structure comprises forming a glue layer, next sputtering a seed layer on said glue layer, next forming a photoresist layer on said seed layer, wherein an opening in said photoresist layer exposes a region of said seed layer, next forming a nickel layer over said region, next removing said photoresist layer, and then removing said seed layer and said glue layer not under said nickel layer;
after said forming said second metallization structure, forming a solder on said second metallization structure; and
mounting a discrete passive component on said solder, wherein said discrete passive component is connected to said second metallization structure through said solder.

33. The method of claim 32, wherein said mounting said discrete passive component comprises mounting a discrete inductor on said solder.

34. The method of claim 32, wherein said mounting said discrete passive component comprises mounting a discrete capacitor on said solder.

35. The method of claim 32, wherein said mounting said discrete passive component comprises mounting a discrete resistor on said solder.

36. The method of claim 32, wherein said forming said solder comprises a screen-printing process.

37. The method of claim 32, wherein said forming said glue layer comprises a sputtering process.

38. The method of claim 32, wherein said forming said nickel layer comprises an electroplating process.

39. The method of claim 32, wherein said forming said glue layer comprises sputtering a titanium-containing layer.

40. The method of claim 32, wherein said forming said glue layer comprises sputtering a chromium-containing layer.

41. The method of claim 32, wherein said sputtering said seed layer comprises sputtering a copper layer on said glue layer.

42. The method of claim 32 further comprising said forming said nickel layer with a thickness between 0.1 and 3 micrometers.

43. The method of claim 32 further comprising providing a polymer layer on said passivation layer, wherein an opening in said polymer layer is over said contact point.

44. The method of claim 32 further comprising providing a layer of polyimide on said passivation layer, wherein an opening in said layer of polyimide is over said contact point.

45. The method of claim 32 further comprising providing a polymer layer with a thickness between 2 and 150 micrometers on said passivation layer, wherein an opening in said polymer layer is over said contact point.

46. The method of claim 18, wherein said mounting said discrete passive component comprises mounting a discrete resistor on said solder.

47. A method of forming a circuit component, comprising:
providing a silicon substrate, a transistor in and on said silicon substrate, a metallization structure over said silicon substrate, wherein said metallization structure comprises a first metal layer and a second metal layer over said first metal layer, a dielectric layer between said first and second metal layers, a metal pad over said silicon substrate, a separating layer over said metallization structure and over said dielectric layer, wherein a first opening in said separating layer is over a contact point of said metal pad, and said contact point is at a bottom of said first opening, wherein said separating layer comprises a nitride layer, and a polymer layer on said separating layer, wherein a second opening in said polymer layer is over said contact point;
providing a metal bump on said contact point and on said polymer layer, wherein said metal bump is connected to said contact point through said second opening, wherein providing a bottom portion of said metal bump comprises forming a third metal layer on said contact point and on said polymer layer, next forming a photoresist layer on said third metal layer, wherein a third opening in said photoresist layer exposes a region of said third metal layer, next electroplating a copper layer over said region, next removing said photoresist layer, and then removing said third metal layer not under said copper layer, wherein said metal bump further comprises a top portion made of a solder over said bottom portion; and
providing a discrete passive component over said top portion of said metal bump and over said polymer layer, wherein said discrete passive component is connected to said contact point through said metal bump.

48. The method of claim 47, wherein said providing said bottom portion of said metal bump further comprises forming a nickel layer on said copper layer.

49. The method of claim 47, wherein said discrete passive component comprises a capacitor.

50. The method of claim 47, wherein said providing said bottom portion of said metal bump further comprises said electroplating said copper layer with a thickness between 3 and 20 micrometers.

51. The method of claim 47, wherein said polymer layer has a thickness between 2 and 150 micrometers.

52. The method of claim 47, wherein said providing said bottom portion of said metal bump further comprises forming a nickel layer on said copper layer, followed by said removing said photoresist layer.

53. The method of claim 47, wherein before said providing said discrete passive component over said top portion of said metal bump and over said polymer layer, said discrete passive component does not join any substrate.

54. The method of claim 1, wherein before said mounting said discrete passive component over said second metallization structure, said discrete passive component does not join any substrate.

55. The method of claim 18, wherein before said mounting said discrete passive component over said second metallization structure, said discrete passive component does not join any substrate.

56. The method of claim 32, wherein before said mounting said discrete passive component on said solder, said discrete passive component does not join any substrate.

* * * * *